United States Patent
Pisek et al.

(10) Patent No.: US 7,895,497 B2
(45) Date of Patent: Feb. 22, 2011

(54) APPARATUS AND METHOD USING REDUCED MEMORY FOR CHANNEL DECODING IN A SOFTWARE-DEFINED RADIO SYSTEM

(75) Inventors: Eran Pisek, Plano, TX (US); Thomas M. Henige, Dallas, TX (US)

(73) Assignee: Samsung Electronics Co., Ltd., Suwon-si (KR)

(*) Notice: Subject to any disclaimer, the term of this patent is extended or adjusted under 35 U.S.C. 154(b) by 1120 days.

(21) Appl. No.: 11/605,525

(22) Filed: Nov. 29, 2006

(65) Prior Publication Data

US 2008/0123781 A1    May 29, 2008

Related U.S. Application Data

(60) Provisional application No. 60/816,555, filed on Jun. 26, 2006.

(51) Int. Cl.
*H03M 13/00* (2006.01)

(52) U.S. Cl. .......... 714/755; 375/340

(58) Field of Classification Search .......... 714/755; 375/340; 712/220
See application file for complete search history.

(56) References Cited

U.S. PATENT DOCUMENTS

| | | | |
|---|---|---|---|
| 6,980,605 B2 * | 12/2005 | Gatherer et al. | 375/340 |
| 7,409,606 B2 * | 8/2008 | Nakai | 714/701 |
| 7,549,113 B2 * | 6/2009 | Lin | 714/794 |
| 2005/0166128 A1 * | 7/2005 | Finn et al. | 714/792 |

* cited by examiner

*Primary Examiner*—Sam Rizk

(57) ABSTRACT

A maximum a posteriori probability (MAP) block decoder for decoding a received data block of input samples. The MAP block decoder segments the received data block into at least a first segment and a second segment and calculates and stores alpha values during forward processing of the first segment. The MAP block decoder uses a first selected alpha value calculated during forward processing of the first segment as initial state information during forward processing of the second segment. The first and second segments may overlap each other, such that the last M samples of the first segment are the same as the first M samples of the second segment.

25 Claims, 11 Drawing Sheets

APPARATUS AND METHOD USING REDUCED MEMORY FOR CHANNEL DECODING IN A SOFTWARE-DEFINED RADIO SYSTEM

CROSS-REFERENCE TO RELATED APPLICATION AND CLAIM OF PRIORITY

This application is related to U.S. Provisional Patent No. 60/816,555, filed Jun. 26, 2006, entitled "Method And Apparatus For Reduced Memory Channel Decoding." Provisional Patent No. 60/816,555 is assigned to the assignee of this application and is incorporated by reference as if fully set forth herein. This application claims priority under 35 U.S.C. §119(e) to Provisional Patent No. 60/816,555.

This application is related to U.S. patent application Ser. No. 11/123,313, filed on May 6, 2005, entitled "Context-based Operation Reconfigurable Instruction Set Processor and Method of Operation" and to U.S. patent application Ser. No. 11/501,335, filed Aug. 9, 2006, entitled "Generic Maximum A posteriori Probability Decoder For Use In Software-Defined Radio Systems." application Ser. Nos. 11/123,313 and 11/501,335 are assigned to the assignee of this application and are incorporated by reference into this application as if fully set forth herein.

TECHNICAL FIELD OF THE INVENTION

The present application relates generally to decoding algorithms and, more specifically, to a channel decoder using reduced memory in a software-defined radio (SDR) system.

BACKGROUND OF THE INVENTION

Many wireless communication standards use block codes, such as turbo codes, to increase the performance of channel decoding. In block coding techniques, the encoding and decoding processes are done on a block-by-block basis. Many standards, such as WiBro, CDMA2000 and WCDMA, use turbo encoding and decoding functions that handle different block sizes, spanning from a few bits to 20 kilobits (e.g., CDMA2000).

Processing an entire block at one time requires sufficient memory to hold all of the intermediate results. By way of example, a dedicated alpha memory is used to hold alpha values that are calculated during a forward processing of the trellis in a turbo decoder. These intermediate result memories may consume at least half of the total turbo decoder memory, including the input-output (I/O) buffers. These intermediate result memories increase proportionally with the block size.

Conventional block decoders reduce these memory requirements by introducing block segmentation techniques, in which the received data block is divided into smaller segments and the smaller segments are then processed one at a time. This reduces the intermediate result memory requirements according to the selected segment size. Unfortunately, switching the intermediate results in and out of memory between segments introduces a large amount of processing overhead, which decreases the supported bit rate significantly.

Therefore, there is a need in the art for an improved reconfigurable decoder for use in a software-defined radio (SDR) system. In particular, there is a need for a maximum a posteriori probability (MAP) decoder that uses a reduced amount of memory to perform channel decoding.

SUMMARY OF THE INVENTION

A maximum a posteriori probability (MAP) block decoder is provided for decoding a received data block of input samples. The MAP block decoder is operable to segment the received data block into at least a first segment and a second segment and calculate and store alpha values during forward processing of the first segment. The MAP block decoder uses a first selected alpha value calculated during forward processing of the first segment as initial state information during forward processing of the second segment.

In an advantageous embodiment, the first and second segments overlap each other, such that the last M samples of the first segment are the same as the first M samples of the second segment. The first segment comprises a first non-overlapping portion and an overlapping portion and the second segment comprises a second non-overlapping portion and the overlapping portion. The first selected alpha value is the last alpha value calculated and stored by the MAP block decoder prior to the overlapping portion of the first segment.

In another embodiment of the disclosure, a method is provided for performing block decoding of a data block of input samples according to the maximum a posteriori probability (MAP) algorithm. The method comprises the steps of receiving the data block of input samples and segmenting the received data block into at least a first segment and a second segment that partially overlaps the first segment. The first segment comprises a first non-overlapping portion and an overlapping portion and the second segment comprises a second non-overlapping portion and the overlapping portion. The method further comprises the steps, during forward processing of the first segment, of calculating and storing alpha values for the first non-overlapping portion of the first segment; retrieving a first selected alpha value calculated during forward processing of the first segment; and using the first selected alpha value as initial state information during forward processing of the second segment.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 10, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

In the descriptions that follow, the reconfigurable maximum a posteriori probability (MAP) decoder disclosed herein is implemented as part of a turbo decoder that provides a high degree of parallelism to support high data rate standards and that has reduced intermediate result memory requirements. The exemplary turbo decoder was disclosed in U.S. patent application Ser. No. 11/225,479, incorporated by reference above. However, it will be understood that the embodiment of the reconfigurable maximum a posteriori probability (MAP) decoder in a turbo decoder is by way of illustration only and should not be construed to limit the scope of this disclosure. The reconfigurable MAP decoder having reduced intermediate result memory requirements disclosed herein may easily be adapted for use in decoders other than turbo decoders.

The reconfigurable MAP decoder and the reconfigurable turbo decoder support multimode operation for decoding in different communication standards, including WCDMA, CDMA2000, IEEE-802.16e (i.e., WiBro), among others. The disclosed MAP and turbo decoders also provide adaptability to support different data rates. WiBro and WCDMA/HSDPA operate at many different data rates. The disclosed MAP and turbo decoder architectures are optimized not only for the maximum data rates but also for different ranges of data rate.

In one embodiment of the disclosure, the reconfigurable MAP and turbo decoders described herein may be implemented using a context-based operation reconfigurable instruction set processor (CRISP) device. CRISP devices are described in detail in U.S. patent application Ser. No. 11/123, 313, which was incorporated by reference above.

The present disclosure introduces a novel method of segmenting the received data block in the receiver. The block decoder operates on the segments without requiring intervention from the host side. The present disclosure uses three (3) registers that hold values defining the block segmentation process: the Segment Size register, the Segment Count register and the Window Size register. Although the unique segmentation process is implemented in a turbo decoder in the embodiments described herein, this is by way of illustration only and should not be construed so as to limit the scope of the present disclosure. Those skilled in the art will appreciate that the segmentation process disclosed herein may easily be adapted for use in other types of block decoder.

Figure 1:
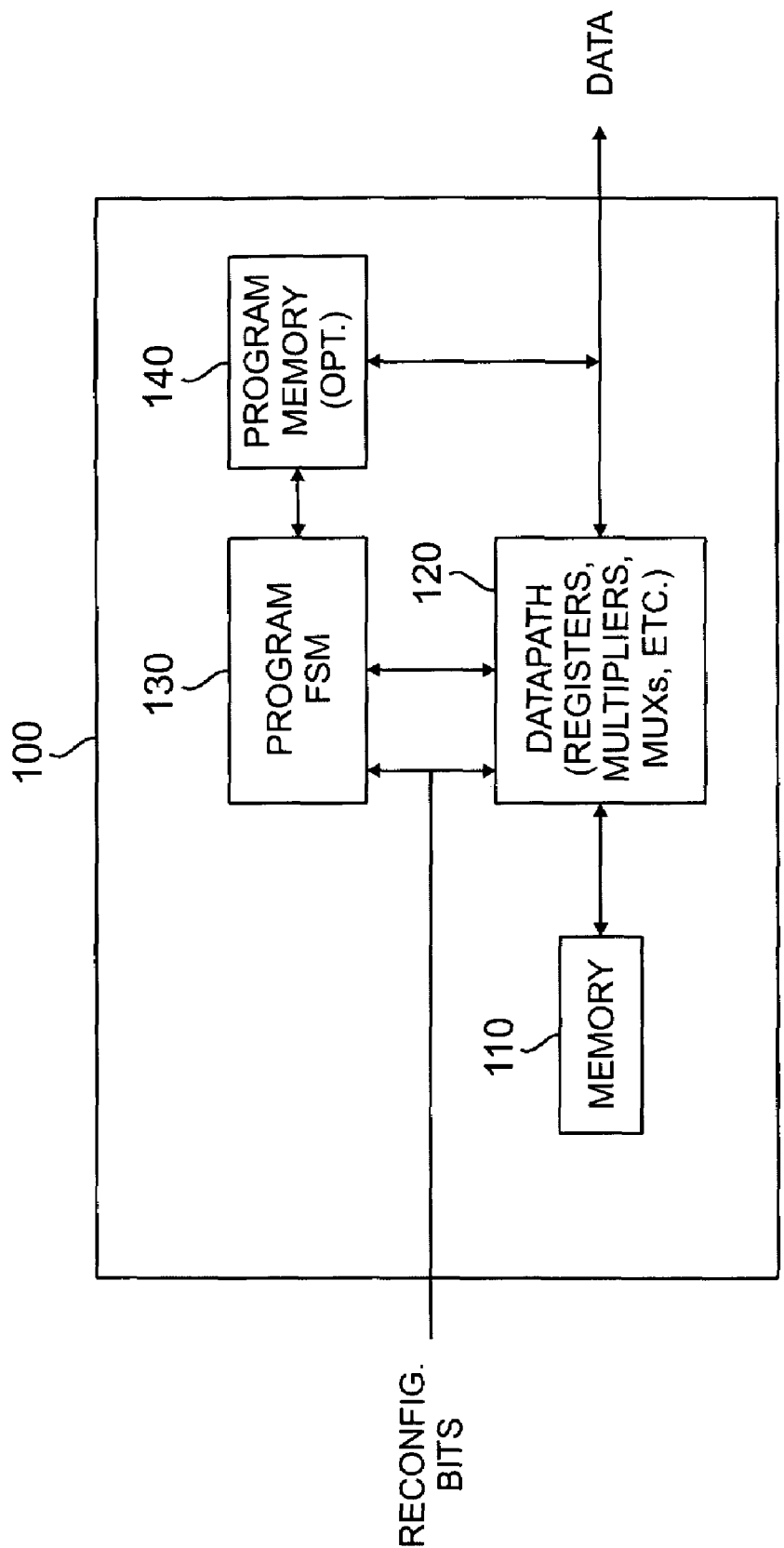
FIG. 1 is a high-level block diagram of a CRISP device that may be used to implement a reconfigurable maximum a posteriori probability (MAP) decoder having reduced memory requirements.

FIG. 1 is a high-level block diagram of context-based operation reconfigurable instruction set processor (CRISP) 100, which may be used to implement a reconfigurable maximum a posteriori probability (MAP) decoder that reduces memory requirements using block segmentation according to the principles of the present disclosure. CRISP 100 comprises memory 110, programmable data path circuitry 120, programmable finite state machine 130, and optional program memory 140. A context is a group of instructions of a data processor that are related to a particular function or application, such as turbo decoding instructions. As described in U.S. patent application Ser. No. 11/123,313, CRISP 100 implements only a subset of context-related instructions in an optimum manner.

Context-based operation reconfigurable instruction set processor (CRISP) 100 defines the generic hardware block that usually consists of higher level hardware processor blocks. The principle advantage to CRISP 100 is that CRISP 100 breaks down the required application into two main domains, a control domain and a data path domain, and optimizes each domain separately. By performing turbo decoding in CRISP 100, the disclosed turbo decoder reduces the problems related to flexibility and power consumption that affect conventional turbo decoders.

The control domain is implemented by programmable finite state machine 130, which may comprise a DSP, an MCU or another prior art device. Programmable FSM 130 is configured by reconfiguration bits received from an external controller (not shown). Programmable FSM 130 may execute a program stored in associated optional program memory 140. The program may be stored in program memory 140 via the DATA line from an external controller (not shown). Memory 110 is used to store application data used by data path circuitry 120.

Programmable data path circuitry 120 is divided into sets of building blocks that perform particular functions (e.g., registers, multiplexers, multipliers, and the like). Each of the building blocks is both reconfigurable and programmable to allow maximum flexibility. The division of programmable data path circuitry 120 into functional blocks depends on the level of reconfigurability and programmability required for a particular application.

Since different contexts are implemented by separate CRISP devices that work independently of other CRISP devices, implementing a turbo decoder using one or more CRISP devices provides an efficient power management scheme that is able to shut down a CRISP when the CRISP is not required. This assures that only the CRISPs that are needed at a given time are active, while other idle CRISPs do not consume significant power.

Figure 2:
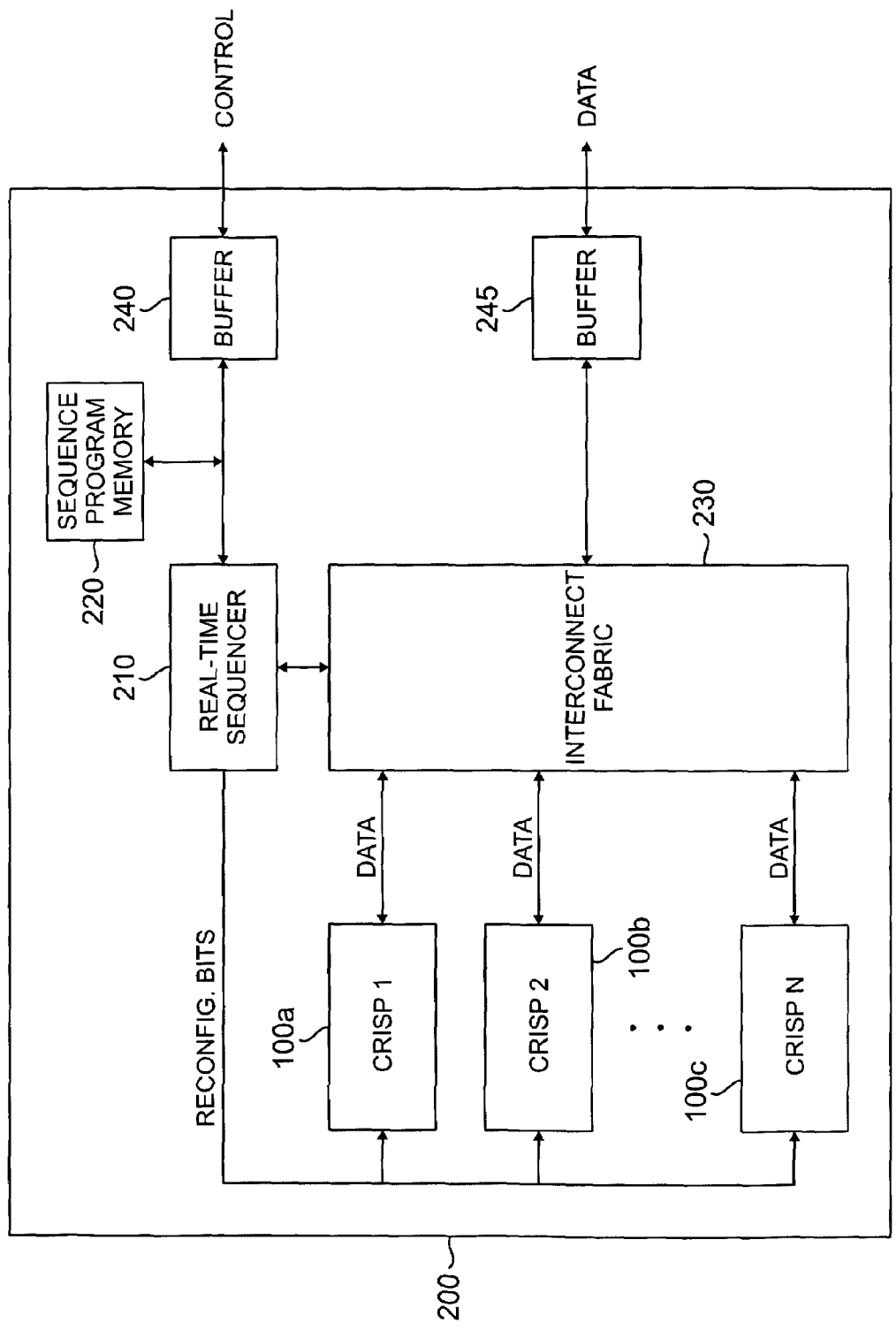
FIG. 2 is a high-level block diagram of a reconfigurable processing system.

FIG. 2 is a high-level block diagram of reconfigurable processing system 200 according to one embodiment of the present disclosure. Reconfigurable processing system 200 comprises N context-based operation reconfigurable instruction set processors (CRISPs), including exemplary CRISPs 100a, 100b, and 100c, which are arbitrarily labeled CRISP 1, CRISP 2 and CRISP N. Reconfigurable processing system 200 further comprises real-time sequencer 210, sequence program memory 220, programmable interconnect fabric 230, and buffers 240 and 245.

Reconfiguration bits may be loaded into CRISPs 100a, 100b, and 100c from the CONTROL line via real-time sequencer 210 and buffer 240. A control program may also be loaded into sequence program memory 220 from the CONTROL line via buffer 240. Real-time sequencer 210 sequences the contexts to be executed by each one of CRISPs 100a-c by retrieving program instructions from program memory 220 and sending reconfiguration bits to CRISPs 100a-c. In an exemplary embodiment, real-time sequencer 210 may comprise a stack processor, which is suitable to operate as a real-time scheduler due to its low latency and simplicity.

Reconfigurable interconnect fabric 230 provides connectivity between each one of CRISPs 100a-c and an external DATA bus via bi-directional buffer 245. In an exemplary embodiment of the present disclosure, each one of CRISPs 100a-c may act as a master of reconfigurable interconnect fabric 230 and may initiate address access. The bus arbiter for reconfigurable interconnect fabric 230 may be internal to real-time sequencer 210.

In an exemplary embodiment, reconfigurable processing system 200 may be a cell phone or a similar wireless device, or a data processor for use in a laptop computer. In a wireless device embodiment based on a software-defined radio (SDR) architecture, each one of CRISPs 100a-c is responsible for executing a subset of context-related instructions that are associated with a particular reconfigurable function. For example, CRISP 100a may be configured to execute context-related instructions that process CDMA baseband signals or OFDMA baseband signals. CRISP 100b may be configured to execute context-related instructions that act as a memory controller. CRISP 100c may be configured to execute context-related instructions that perform turbo decoding or Viterbi decoding.

Since CRISP devices are largely independent and may be run simultaneously, a turbo decoder implemented using one or more CRISP devices has the performance advantage of parallelism without incurring the full power penalty associated with running parallel operations. The loose coupling and independence of CRISP devices allows them to be configured for different systems and functions that may be shut down separately.

Figure 3:
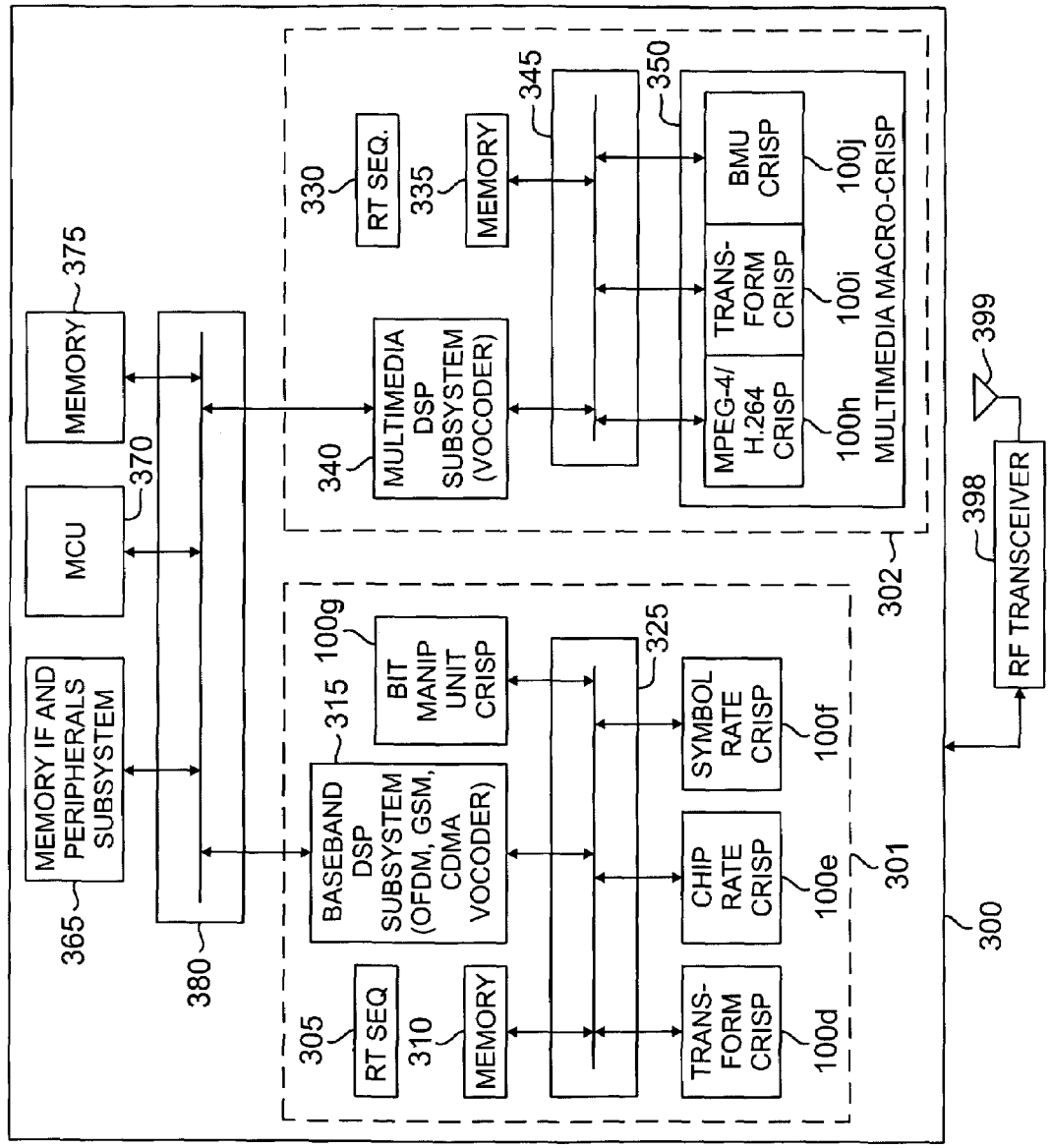
FIG. 3 is a high-level block diagram of a multi-standard software-defined radio (SDR) system that implements a reconfigurable maximum a posteriori probability (MAP) decoder having reduced memory requirements.

FIG. 3 is a high-level block diagram of multi-standard software-defined radio (SDR) system 300, which implements a reconfigurable maximum a posteriori probability (MAP) decoder that reduces the size of the intermediate results memory by using block segmentation according to the principles of the disclosure. SDR system 300 may comprise a wireless terminal (or mobile station, subscriber station, etc.) that accesses a wireless network, such as, for example, a GSM or CDMA cellular telephone, a PDA with WCDMA, IEEE-802.11x, OFDM/OFDMA capabilities, or the like.

Multi-standard SDR system 300 comprises baseband subsystem 301, applications subsystem 302, memory interface (IF) and peripherals subsystem 365, main control unit (MCU) 370, memory 375, and interconnect 380. MCU 370 may comprise, for example, a conventional microcontroller or a microprocessor (e.g., x86, ARM, RISC, DSP, etc.). Memory IF and peripherals subsystem 365 may connect SDR system 300 to an external memory (not shown) and to external peripherals (not shown). Memory 375 stores data from other components in SDR system 300 and from external devices (not shown). For example, memory 375 may store a stream of incoming data samples associated with a down-converted signal generated by radio frequency (RF) transceiver 398 and antenna 399 associated with SDR system 300. Interconnect 380 acts as a system bus that provides data transfer between subsystems 301 and 302, memory IF and peripherals subsystem 365, MCU 370, and memory 375.

Baseband subsystem 301 comprises real-time (RT) sequencer 305, memory 310, baseband DSP subsystem 315, interconnect 325, and a plurality of special purpose context-based operation instruction set processors (CRISPs), including transform CRISP 100d, chip rate CRISP 100e, symbol rate CRISP 100f, and bit manipulation unit (BMU) CRISP 100g. By way of example, transform CRISP 100d may implement a Fast Fourier Transform (FFT) function, chip rate CRISP 100e may implement a correlation function for a CDMA signal, and symbol rate CRISP 100f may implement a turbo decoder function or a Viterbi decoder function.

In such an exemplary embodiment, transform CRISP 100d may receive samples of an intermediate frequency (IF) signal stored in memory 375 and perform an FFT function that generates a sequence of chip samples at a baseband rate. Next, chip rate CRISP 100e receives the chip samples from transform CRISP 100d and performs a correlation function that generates a sequence of data symbols. Next, symbol rate CRISP 100f receives the symbol data from chip rate CRISP 100e and performs turbo decoding or Viterbi decoding to recover the baseband user data. The baseband user data may then be used by applications subsystem 302.

In an exemplary embodiment of the present disclosure, symbol rate CRISP 100f may comprise two or more CRISPs that operate in parallel. Also, by way of example, BMU CRISP 100g may implement such functions as variable length coding, cyclic redundancy check (CRC), convolutional encoding, and the like. Interconnect 325 acts as a system bus that provides data transfer between RT sequencer 305, memory 310, baseband DSP subsystem 315 and CRISPs 100d-100g.

Applications subsystem 302 comprises real-time (RT) sequencer 330, memory 335, multimedia DSP subsystem 340, interconnect 345, and multimedia macro-CRISP 350. Multimedia macro-CRISP 350 comprises a plurality of special purpose context-based operation instruction set processors, including MPEG-4/H.264 CRISP 550h, transform CRISP 550i, and BMU CRISP 100j. In an exemplary embodiment of the disclosure, MPEG-4/H.264 CRISP 550h performs motion estimation functions and transform CRISP 100h performs a discrete cosine transform (DCT) function. Interconnect 380 provides data transfer between RT sequencer 330, memory 335, multimedia DSP subsystem 340, and multimedia macro-CRISP 350.

In the embodiment in FIG. 3, the use of CRISP devices enables applications subsystem 302 of multi-standard SDR system 300 to be reconfigured to support multiple video standards with multiple profiles and sizes. Additionally, the use of CRISP devices enables baseband subsystem 301 of multi-standard SDR system 300 to be reconfigured to support multiple air interface standards. Thus, SDR system 300 is able to operate in different types of wireless networks (e.g., CDMA, GSM, 802.11x, etc.) and can execute different types of video and audio formats. However, the use of CRISPS according to the principles of the present disclosure enables SDR system 300 to perform these functions with much lower power consumption than conventional wireless devices having comparable capabilities.

Figure 4A:
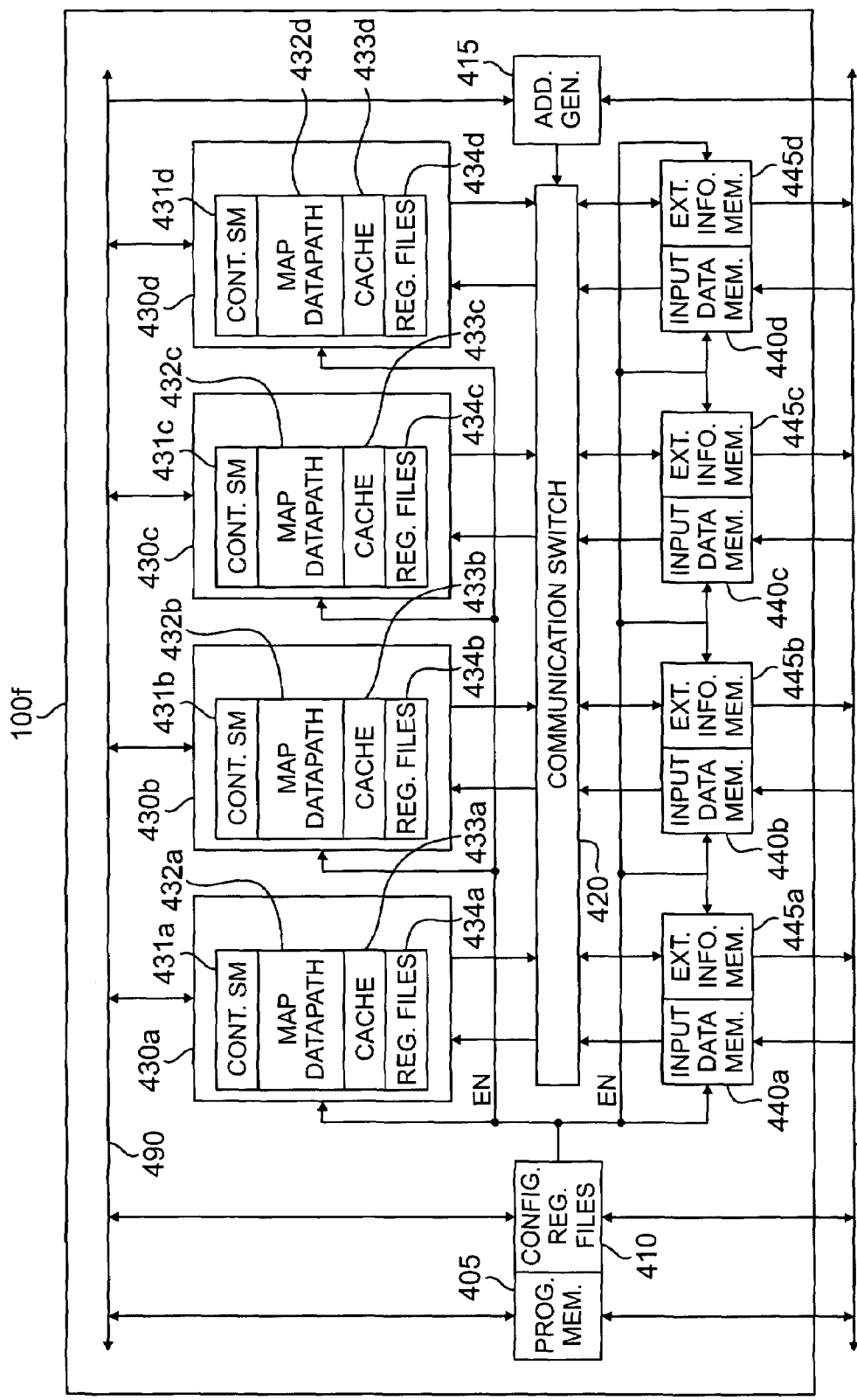
FIG. 4A is a block diagram of a reconfigurable turbo decoder implemented in a CRISP according to the principles of the disclosure.

FIG. 4A is a block diagram of a reconfigurable turbo decoder implemented in CRISP 100f according to the principles of the disclosure. Turbo decoder CRISP 100f comprises program memory 405, configuration register files 410, address generator 415, communication switch 420, processing units 430a-430d, input data memories 440a-440d, extrinsic information memories 445a-445d, and internal bus 490. Each one of processing units 430a-430d comprises a control state machine (SM), a maximum a posteriori probability (MAP) datapath, a cache, and control register files. By way of example, processing unit 430 comprises control state machine 431a, MAP datapath 432a, cache 433a, and control register files 434a. Although four processing units 430 are illustrated in FIG. 4A, this is by way of example only. Other embodiments of turbo decoder CRISP 100f may implement less than four processing units 430 or more than four processing units 430.

A conventional MAP turbo decoder architecture generally comprises two primary functional blocks: i) soft-input, soft-output (SISO) stages that implement an a posteriori probability (APP) algorithm; and ii) an interleaver/deinterleaver that scrambles the data according to the interleaving rules followed by the encoder in the transmitting device. Other blocks are required for the implementation of the decoder, such as a RAM (random-access memory) for storing data from each iteration of the decoder. Turbo decoder CRISP 100f includes all the building blocks of a conventional MAP turbo decoder. In an exemplary embodiment, each one of MAP datapaths 432a-432d implements a sliding window MAP algorithm. However, alternate embodiments of turbo decoder CRISP 100f may implement non-sliding window MAP algorithms.

In turbo decoder CRISP 100f, MAP datapaths 432a, 432b, 432c and 432d temporarily store the values of $\alpha$ (alpha), $\beta$ (beta), and $\lambda$ (lambda) in caches 433a, 433b, 433c, and 433d. The extrinsic information (i.e., the $\lambda$ values) from each iteration for each decoding block is stored in extrinsic information memories 445a, 445b, 445c and 445d via communication switch 420. In an exemplary embodiment, MCU 370 loads a configuration program and configuration data into turbo decoder CRISP 100f via an external system bus (i.e., interconnect 325). The configuration program is stored in program memory 405. MCU 370 loads the configuration data into configuration register files 410 and control register files 434a-434d in order to initialize the register files. Configuration register files 410 and control register files 434a-434d are used to control which processing units 430a-430d, input data memories 440a-440d, and extrinsic information memories 445a-445d are used in an application. Configuration register files 410 provide enable (EN) signals to control processing units 430, input data memories 440, and extrinsic information memories 445. Turbo decoder CRISP 100f reads input data samples and writes decoded output data via the system bus (i.e., interconnect 325).

In order to achieve high decoding rates, turbo decoder CRISP 100f implements N parallel processing units 430a-430d. In this example, N=4. Processing units 430a-430d are independent and identical to each other. Each one of processing units 430a-430d is capable of connecting to each one of input data memories 440a-440d and extrinsic information memories 445a-445d via communication switch 420. For higher data rate standards, all of processing units 430a-430d may operate simultaneously and in parallel. For lower data rate standards, one or more of processing units 430a-430d may be set to a sleep mode (i.e., deactivated or disabled) in order to reduce power consumption.

As noted above, each one of processing units 430a-430d comprises control state machine 431, MAP datapath 432, cache 433 and control register files 434. In an exemplary embodiment of turbo decoder CRISP 100f, each processing unit 430 processes two soft input data samples at a time. The two soft input data samples correspond to two data symbols. In an exemplary embodiment, each soft input data sample may comprise 8 bits. MAP datapath 432 performs both forward and backward recursions over the trellis. During the forward recursion and optionally also during the backward recursion, both the input symbol and the extrinsic ($\lambda$) information must be accessed to compute the branch metric, $\gamma$ (gamma). In order to reduce memory access power consumption, the $\gamma$ value may be computed and stored in cache 433 in each processing unit 430. If the values of $\alpha$, $\beta$, and $\lambda$ are not calculated simultaneously, the $\alpha$ value may also be stored in cache 430 to reduce data movement and power consumption.

MAP datapath 432 may compute the $\alpha$, $\beta$, and $\lambda$ values in parallel or in consecutive (or sequential) order. Parallel execution is faster, but requires more die space and power consumption. Consecutive processing incurs longer delays, but requires less die space and less power consumption. In an exemplary embodiment, each one of MAP datapaths 430a-430d computes the $\alpha$, $\beta$, and $\lambda$ values sequentially. Control state machine 431 decodes instructions from program memory received via internal bus 490 and controls the overall operation and configuration of processing unit 430. Since turbo decoder CRISP 100f may compute large instruction loops, control state machine 431 may use a hardware loop to reduce overhead and power consumption.

There are eight memory blocks in turbo decoder CRISP 100f: four input data memories 440a that hold the input data (or symbol) samples and four extrinsic information memories 445 that hold the extrinsic information (i.e., $\lambda$ values) generated in each half iteration of the turbo decoder. The eight memory blocks are divided into four groups. Each memory group includes one input data memory 440 and one extrinsic information memory 445. By way of example, input data memory 440a and extrinsic information memory 445a form a first memory group, input data memory 440b and extrinsic information memory 445b form a second memory group, and so forth.

Each one of processing units 430a-430d reads and writes to one memory group at a time. Each one of processing units 430a-430d is capable of writing to each one of the memory groups. Thus, none of the memory groups is dedicated to a specific processing unit 430. For example, processing unit 430a may be connected by communication switch 420 to a first memory group (e.g., memories 440a and 445a) during one memory cycle and may read from or write to another memory group (e.g., memories 440c and 445c) during another memory cycle.

Communication switch 420 dynamically controls the connections between processing units 430a-430d and the memory groups comprised of memories 440a-440d and memories 445a-445d. The connection order or pattern is determined by the operation of address generator 415. Thus, communication switch 420 performs the interleaver and deinterleaver operations for a MAP decoder. In one embodiment of the disclosure, address generator 415 may be implemented by a memory. In such an embodiment, the external control DSP/MCU, such as MCU 370, pre-computes offline the interleaver pattern of the turbo decoder and writes the interleaver pattern to the memory of address generator 415 during an initialization phase. In another embodiment of the disclosure, address generator 415 may be designed to generate the interleaver pattern in real time. According to the principles of the disclosure, MAP datapaths 432a-d are reconfigurable devices that may be modified to operate in turbo decoders or other types of decoders and may be modified to operate under different RF protocols. Thus, MAP datapaths 432a-d provide a generic architecture to support not only α (alpha), β (beta), λ (lambda), and γ (gamma) calculations, but also to support different communication systems that use MAP decoders.

Figure 4B:
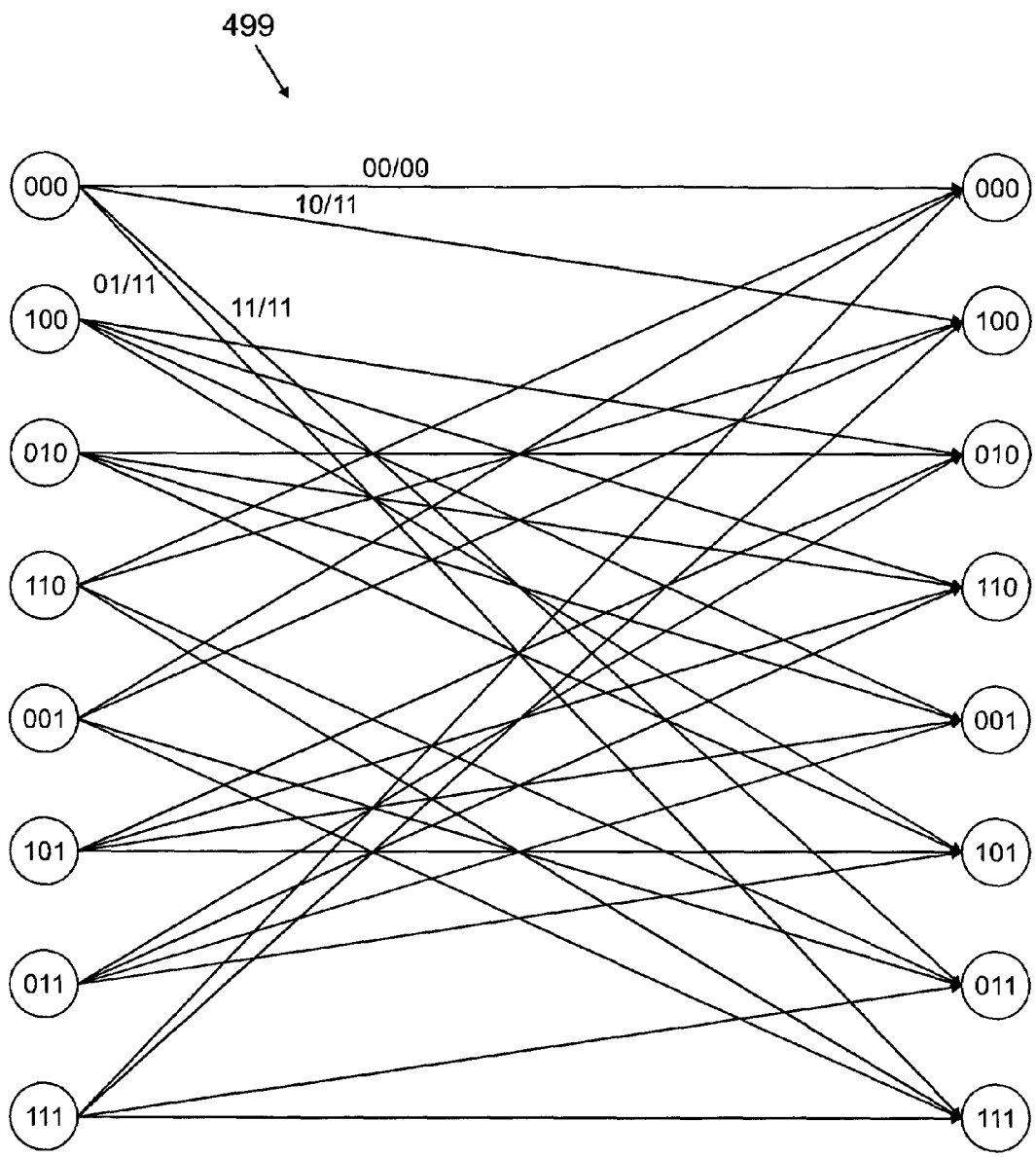
FIG. 4B is an exemplary trellis diagram for a WiBro wireless network.

A MAP algorithm may be represented by a trellis. Different communication systems, such as WCDMA, WiBro, or the like, use different trellises. FIG. 4B illustrates exemplary trellis 499 for a WiBro wireless network that may be implemented by reconfigurable MAP datapaths 432a-d. Inside trellis 499 in FIG. 4B, alpha, beta and lambda are calculated in either the forward direction or the backward direction. It is noted that there are eight states in trellis 499 and that there are four paths leading from a state at time t to a state at time t+1. This means there are 32 possible paths between states in trellis 499.

As is well known, a conventional turbo encoder uses two constituent encoders. A first encoder receives an original bit stream and generates a first parity bit stream. A second encoder receives an interleaved copy of the original bit stream and generates a second parity bit stream. The data transmitted by the turbo encoder comprises the original bit stream, the first parity bits from the first encoder, and the second parity bits from the second encoder.

Figure 5A:
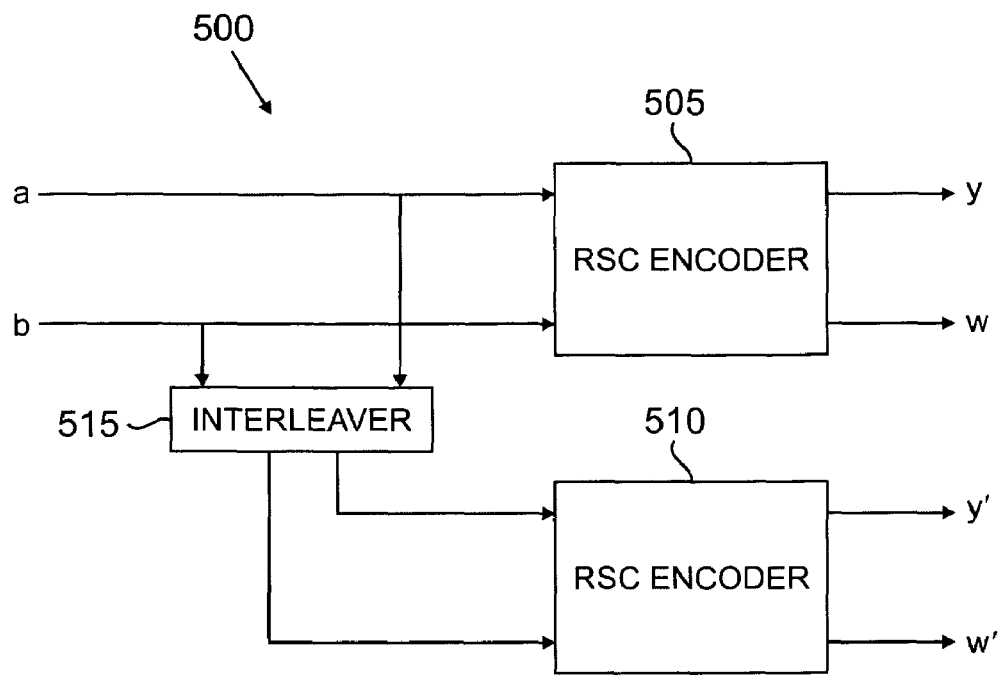
FIG. 5A is a high-level block diagram illustrating a duobinary encoder according to one embodiment of the disclosure.

FIG. 5A is a high-level block diagram illustrating duobinary encoder 500 according to an exemplary embodiment of the present disclosure. Duobinary encoder 500 comprises recursive systematic code (RSC) encoders 505 and 510 and interleaver 515. In a duo-binary encoder (i.e., WiBro mode), a first sequence of the inputs a and b is applied to RSC encoder 505 and a second, interleaved sequence of the inputs a and b is applied to RSC encoder 510. The first encoder (RSC encoder 505) outputs the first parity bit stream (y, w), and the second encoder (RSC encoder 510) outputs the second parity bit stream (y', w').

Figure 5B:
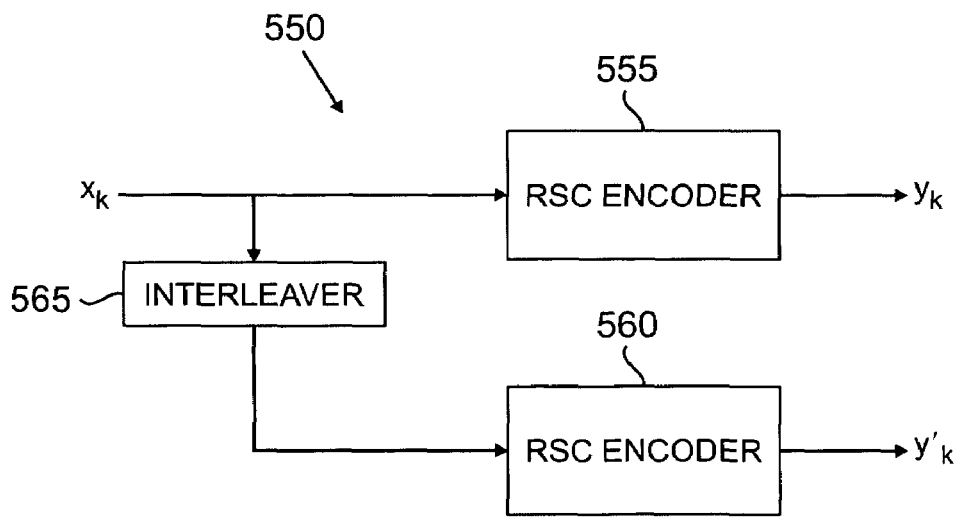
FIG. 5B is a high-level block diagram illustrating a binary encoder according to one embodiment of the disclosure.

FIG. 5B is a high-level block diagram illustrating binary encoder 550 according to an exemplary embodiment of the present disclosure. Binary encoder 550 comprises recursive systematic code (RSC) encoders 555 and 560 and interleaver 565. In a binary turbo encoder (i.e., WCDMA mode), a first sequence of input $x_k$ is applied to RSC encoder 555 and a second, interleaved sequence of the input $x_k$ is applied to RSC encoder 560. The first encoder (RSC encoder 555) outputs the first parity bit stream $y_k$ and the second encoder (RSC encoder 560) outputs the second parity bit stream $y'_k$.

Figure 6:
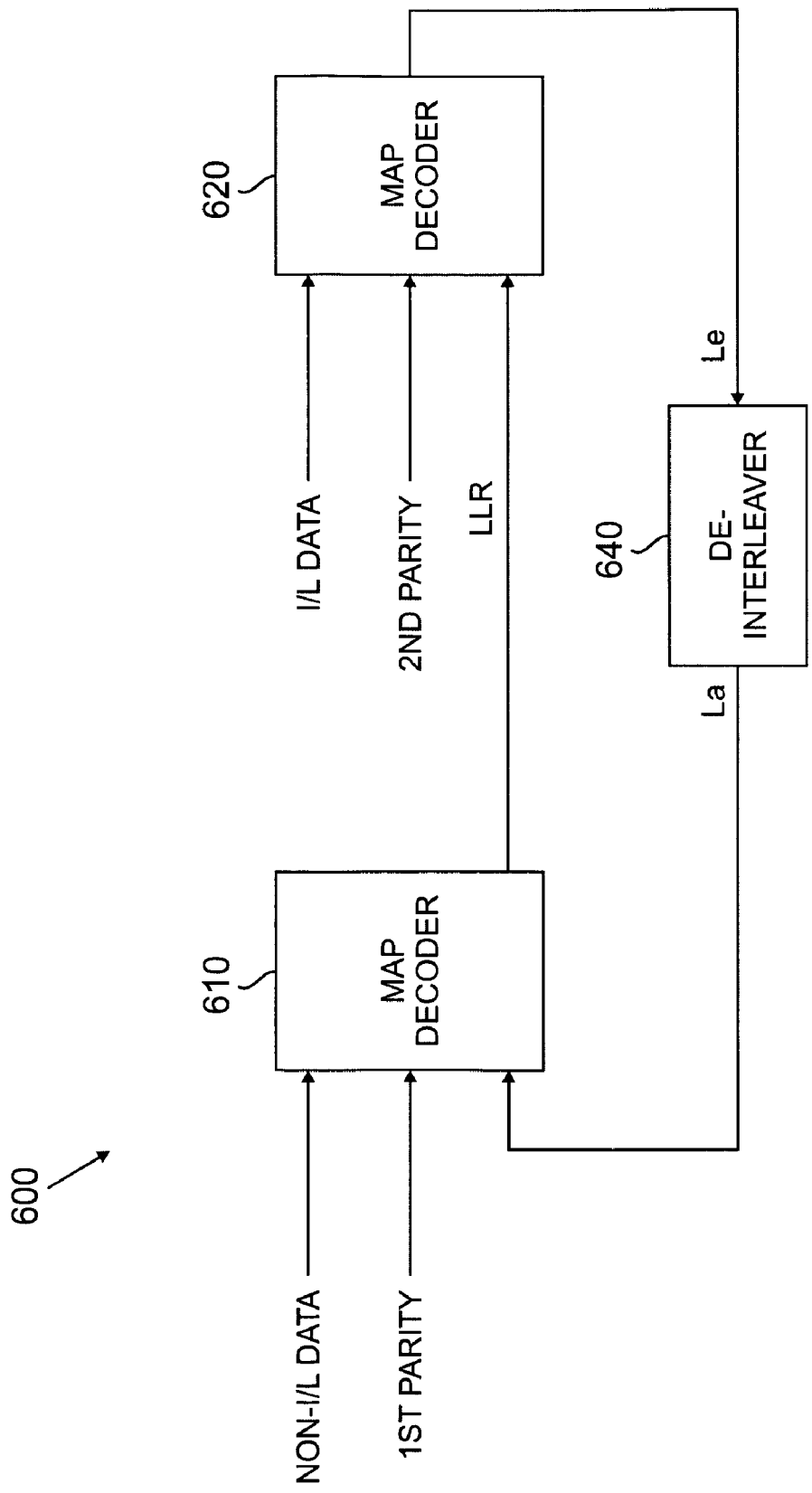
FIG. 6 is a high-level block diagram illustrating a turbo decoder according to one embodiment of the disclosure.

FIG. 6 is a high-level block diagram illustrating turbo decoder 600 according to an exemplary embodiment of the present disclosure. Each one of processing units 430a-430d implements a turbo decoder similar to turbo decoder 600. Turbo decoder 600 comprises maximum a-posterior probability (MAP) decoder block 610, maximum a-posterior probability (MAP) decoder block 620, and deinterleaver block 640. MAP decoders 610 and 620 operate in an iterative manner. MAP decoder 620 generates a new sequence of soft decision outputs that are fed back to MAP decoder 610 via deinterleaver block 640. This process may be iterated several times to increase the reliability of the decoded sequence.

MAP decoder block 610 receives data samples (soft values) from the demodulator corresponding to the non-interleaved (non-I/L) original data bits (e.g., $x_k$ or (a,b) from FIGS. 5A and 5B), the first parity bits (e.g., $y_k$ or (y,w) from FIGS. 5A and 5B) processed by the first encoder (505 or 555) in the transmitter, and the input $L_a$, which is the extrinsic (λ) information from MAP decoder 620. MAP decoder block 610 uses the original data bits and the first parity bits to estimate the probability, or log likelihood ratio (LLR), that the value of each original data bit is a Logic 1 or a Logic 0. MAP decoder block 620 receives data samples (soft values) from the demodulator corresponding to the interleaved (I/L) original data bits (e.g., interleaved $x_k$ or interleaved (a,b) from FIGS. 5A and 5B), the second parity bits (e.g., $y'_k$ or (y',w') from FIGS. 5A and 5B) processed by the second encoder (510 or 560), and the probability estimates (LR) from MAP decoder block 610.

The process of decoding by MAP decoder blocks 610 and 620 comprises one iteration of turbo decoder 600. Turbo decoder 600 may perform a fixed number of iterations or half iterations or may perform iterations until some external mechanism determines that additional iterations will not improve the bit error rate (BER) for a particular data frame. A hard decision is then made on the last soft outputs to determine the original data bits.

As is well known, a MAP algorithm is a trellis decoding algorithm, similar to the Viterbi algorithm. The MAP algorithm within the two decoder blocks operates on soft inputs (i.e., the demodulator outputs and the probability estimates) and produces soft outputs. The following description summarizes the MAP algorithm computations performed by one iteration of one decoder block. It should be noted that the exemplary turbo decoder processes two (2) input symbols at a time. In the case of duo-binary code (i.e., WiBro mode), the two input symbols to turbo decoder 600 are a, b, y, w, y' and w' from a single time sample. In the case of binary code (i.e., WCDMA mode), the inputs to the turbo decoder are $x_1$, $y_1$, and $y'_1$ from a first time sample and $x_2$, $y_2$, and $y'_2$ from a second time sample. Processing two input symbols at a time requires a radix-4 trellis mechanism, as shown in FIG. 4B.

In a first step, a conventional MAP algorithm may compute and store branch metrics, called gamma (or γ) values, for all branches of the trellis. Alternatively, in the first step, the MAP algorithm may perform an "on-the-fly" calculation of the branch metric for each alpha stage or beta stage. The branch metrics are the exponentials of the negatives of the distances between the hard encoder values and the soft received values from the demodulator, divided by the channel noise variance, multiplied by the probability estimate from the previous decoder. In the logarithmic domain, the branch metric (gamma) values are merely the summation of the above parameters.

In a second step, the conventional MAP algorithm performs a forward recursion on the trellis. The forward recursion computes an alpha (or α) value for each node in the trellis. The α value is the sum of: i) the previous α value times the branch metric along one branch from a previous node, ii) the previous α value times the branch metric along another branch from a previous node, iii) the previous α value times the branch metric along one branch from another previous node, and iv) the previous α value times the branch metric along another branch from a previous node. In the logarithmic domain, the alpha values are the summation of the above parameters and finding the survivor between the four candidates, as described below.

In a third step, the conventional MAP algorithm performs a backward recursion on the trellis. The backward recursion computes a beta (or β) value for each node in the trellis. The β values are computed in a manner similar to the α values, except that the backward recursion starts at the end of the trellis and progresses in the reverse direction.

In a fourth step, the conventional MAP algorithm computes the log likelihood ratio (LLR), or λ (lambda) value, for each time t. In the case of a binary code, this value is the sum of the products of the α, β, and γ values for each branch at time t that is associated with a Logic 1 value in the encoder, divided by the sum of the products of the α, β, and γ values for each branch at time t that is associated with a Logic 0 value in the encoder. In the case of a duo-binary code, there are four (4) λ (lambda) values for each time t: λ00, λ01, λ10 and λ11. The λ00 value is the sum of the products of the α, β, and γ values for each branch at time t that is associated with a Logic "00" value in the encoder. The λ01 value is the sum of the products of the α, β, and γ values for each branch at time t that is associated with a Logic "01" value in the encoder. The λ10 value is the sum of the products of the α, β, and γ values for each branch at time t that is associated with a Logic "10" value in the encoder. The λ11 value is the sum of the products of the α, β, and γ values for each branch at time t that is associated with a Logic "11" value in the encoder.

Usually all lambdas are normalized by the L00 value and only three (3) lambdas—L01, L10, and L11—are saved and used for the next half iteration. Finally, the conventional MAP algorithm computes the extrinsic information that is to be sent to the next decoder in the iteration sequence. For binary code (i.e., WCDMA), the extrinsic information is the LLR value minus the input probability estimate. The computations described above are repeated in each iteration by each of the two decoder blocks. After all iterations are completed, decoded information bits may be detected by making a decision on each data bit or data pair. Alternatively, in both codes, the LLR values may be output to an external device that makes a decision on each data bit or data pair.

According to the principles of the present disclosure, the soft decisions are obtained using a MAP algorithm that is similar to the Viterbi algorithm with two major modifications. First, unlike the Viterbi algorithm, the trellis is swept twice—once in the forward direction and once in the reverse direction. Also, the add-compare-select (ACS) operation is replaced by the more complex max*operation (explained below).

The Log-Likelihood Ratio (LLR)—The binary values, Logic 0 and Logic 1, are represented by amplitudes (or signal levels) of +1 and −1, respectively, which are transferred to the receiver via a noisy channel. In the receiving device, the values of the soft symbols are distributed with characteristics depending on the channel. Without loss of generality, the descriptions that follow discuss the case of an additive white Gaussian noise (AWGN) channel. The input symbols into the decoder are normally distributed with centers around values +1 and −1.

The standard deviation, σ, is given by:

$$\sigma^2 = 0.5\left(\frac{E_b}{N_0}\right)^{-1},$$  [Eqn. 1]

where $E_b$ is the energy per bit and $N_0$ is the channel noise. Hereafter, the following notations are used: i) the value, $\vec{Y}$, is a received sequence that includes systematic and parity information; and ii) $Y_k \equiv (X_k, Y_k^0, Y_k^1 \ldots)$ is the noisy version of the unperturbed sequence $(x_k, y_k^0, y_k^1 \ldots)$.

The decoder decides whether a soft input bit represents a Logic 1 or Logic 0 based on a maximum a posteriori likelihood process. If $L_2 > L_1$, the received bit, $X_k$, is decoded as $d_k = +1$. Otherwise, the received bit, $X_k$, is decoded as $d_k = -1$.

For a received sequence, $\vec{Y}$, an observation, $X_k$, at the kth time interval is decoded as a Logic 1 if the a posteriori likelihood, $P(d_k = -1 | \vec{Y})$, exceeds the a posteriori likelihood, $P(d_k = +1 | \vec{Y})$. This may be expressed as:

$$\frac{P(d_k = +1 | \vec{Y})}{P(d_k = -1 | \vec{Y})} < 1.$$  [Eqn. 2]

From Equation 2, it is noted that a bit is decoded according to the sign of the log-likelihood ratio (LLR). From Bayes theorem, it may be shown:

$$P(d_k = \pm 1 | \vec{Y}) = p(\vec{Y} | d_k = \pm 1) P(d_k = \pm 1).$$  [Eqn. 3]

Combining Equations 2 and 3 and taking the log of both sides yields the log-likelihood ratio (LLR), which is a useful metric in turbo decoding:

$$L(d_k) \equiv \log\left(\frac{P(d_k = +1 | \vec{Y})}{P(d_k = -1 | \vec{Y})}\right)$$  [Eqn. 4]

$$= \log\left(\frac{p(\vec{Y} | d_k = +1)}{p(\vec{Y} | d_k = -1)}\right) + \log\left(\frac{P(d_k = +1)}{P(d_k = -1)}\right)$$

It is noted that the last term of the right-hand side of Equation 4 is the extrinsic information and is denoted as $L_e(d_k)$.

MAP Decoding for Binary Turbo Codes

During the iterative process, the extrinsic information, $L_e(d_k)$, is generated by the first decoder (i.e., MAP decoder block 610) and then fed into the second decoder (i.e., MAP decoder block 620). The first term on the right-hand side of Equation 4 has two parts:

$$\log\frac{p(\vec{Y} | d_k = +1)}{p(\vec{Y} | d_k = -1)} = L_c X_k + L_a(d_k)$$  [Eqn. 5]

The value $L_c$ is the channel information and depends solely on the statistic of the channel. For an AWGN channel, $$L_c = 4\frac{rE_b}{N_0},$$  [Eqn. 6]

where r is the code rate. The value, $L_a$, is the extrinsic information fed back to MAP decoder block 610 by MAP decoder block 620. At the start of the decoding process, $L_a$ is set to zero.

The iterative decoding process goes as follows. First, the a-priori information, $L_a(d_k)$, is calculated from the other decoder by interleaving or deinterleaving its extrinsic information. Next, $L(d_k)$ is calculated as shown in Equation 8 below. Finally, the extrinsic information for the other encoder is calculated using:

$$L_e(d_k) = L(d_k) - L_c X_k - L_a(d_k).$$  [Eqn. 7]

Calculation of LLR—A brief discussion of maximum a posteriori (MAP) symbol-by-symbol algorithms for convolutional codes is now presented. Three different decoding schemes are discussed: i) Log-MAP; ii) Max-Log-MAP; and iii) Linear Max*-Log-MAP. Because of the large number of multiplications and numerical instabilities, it is preferable to operate in the logarithmic domain in order to solve the numerical problem and reduce processing complexity.

The following notations are used: i) S is the set of all $2^m$ encoder states; ii) $s_k$ is the encoder state at time k; and iii) $S^+$ is the set of ordered pairs (s',s) such that if $s_{k-1}=s'$ and the new data input bit is +1, the transition $s_{k-1}=s' \to s_k=s$ occurs. The set $S^-$ is similarly defined for input bit −1.

The Log-MAP Algorithm—It can be shown that $L(d_k)$ has the following form:

$$L(d_k) = \log\left(\frac{\sum_{S+} \exp(\alpha_{k-1}^s + \beta_k^{s'} + \gamma_k^{1,s' \to s})}{\sum_{S-} \exp(\alpha_{k-1}^s + \beta_k^{s''} + \gamma_k^{-1,s'' \to s})}\right). \quad \text{[Eqn. 8]}$$

The value $\alpha$ is the forward state metric, the value $\beta$ is the reverse state metric, and the value $\gamma$ is the branch metric. The value S+ is the set of ordered pairs (s,s') corresponding to all state transitions from state s' at time k−1 to state s at time k due to input bit $d_k$=+1. The value S− is similarly defined for the case where $d_k$=−1.

The values $\alpha$ and $\beta$ are calculated recursively using:

$$\alpha_k^s = \log\sum_{s'} \exp(\alpha_{k-1}^{s'} + \gamma^{d_k,s \to s'}), \beta_{k-1}^{s'} = \log\sum_{s} \exp(\beta_k^s + \gamma^{d_k,s \to s'}) \quad \text{[Eqn. 9]}$$

The boundary conditions for $\alpha$ and $\beta$ are:

$$\alpha_0^0 = 0, \alpha_0^{s \neq 0} = -\infty, \beta_{N-1}^0 = 0, \beta_{N-1}^{s \neq 0} = -\infty \quad \text{[Eqn. 10]}$$

The branch metric, $\gamma^{d_k, s \to s'}$, is given by:

$$\gamma^{d_k,s \to s'} = \exp\left(\frac{1}{2}\left(d_k L_c(X_k) + \sum_j L_c y_k^j Y_k^j + d_k L_e(d_k)\right)\right) \quad \text{[Eqn. 11]}$$

It is noted that the last term in Equation 11 contains the extrinsic information.

The Max-Log-MAP Algorithm—The implementation of the Log-MAP algorithm described above requires significant decoder complexity. The Max-Log-MAP algorithm is a simple approximation of the Log-MAP algorithm. It is noted that the calculation of the forward and reverse path metrics in Equation 9 involves a log-add operation. The max*operator is defined as:

$$\max^*(x,y) \equiv \log(e^x + e^y). \quad \text{[Eqn. 12]}$$

When this expression is computed exactly, it equals:

$$\max^*(x,y) = \max(x,y) + \log(1 - e^{|x-y|}). \quad \text{[Eqn. 13]}$$

A zero-order approximation to Equation 13 is obtained by equating:

$$\max^*(x,y) \approx \max(x,y) \quad \text{[Eqn. 14]}$$

Hence, expressions of type $$\log\sum_i \exp(x_i)$$

become:

$$\log\sum_i \exp(x_i) \approx \max_i(x_i) \quad \text{[Eqn. 15]}$$

Using this result yields the following approximations for $\alpha$ and $\beta$":

$$\alpha_k^s \approx \max_{s'}(\alpha_{k-1}^{s'} \gamma^{d_k,s \to s'}), \beta_{k-1}^s \approx \max_{s'}(\beta_k^{s'} + \gamma^{d_{k+1},s \to s'}) \quad \text{[Eqn. 16]}$$

The LLR is approximated as:

$$L(d_k) \approx \max_{s,s'd_k=1}(\alpha_{k-1}^{s'} + \beta_k^s + \gamma_k^{1,s \to s'}) - \max_{s,s'd_k=-1}(\alpha_{k-1}^{s'} + \beta_k^s + \gamma_k^{-1,s \to s'}) \quad \text{[Eqn. 17]}$$

The Linear Max*-Log-MAP Algorithm—Since the max*operation is performed twice for each node in the trellis, the numerical errors due to the approximation in Equation 14 may lead to significant performance degradation. The linear Max*-Log-MAP algorithm adds a linear order correction term to Equation 14:

$$\max^*(x,y) \approx \max(x,y) + \begin{cases} 0 & \text{if } |x-y| > T \\ C(|x-y| - T) & \text{if } |x-y| \leq T \end{cases} \quad \text{[Eqn. 18]}$$

The values of C and T that minimize the mean square error are C=−0.24904 and T=2.5068. These values may be determined by considering a convenient fixed-point implementation.

MAP Decoding for Duo-binary Turbo Codes—Unlike the decoding process for a binary turbo code, in which one binary symbol is represented by one log-likelihood ratio, the decoding process for a duo-binary turbo code calculates three log-likelihood ratios $L^{(z)}(d_k)$ for each symbol:

$$L^{(z)}(d_k) \equiv \frac{P(d_k = z \mid \vec{Y})}{P(d_k = 00 \mid \vec{Y})} \quad \text{[Eqn. 19]}$$

$$= \log\left(\frac{\sum_{s,s',z} \exp(\alpha_{k-1}^s + \beta_k^{s'} + \gamma_k^{z,s' \to s})}{\sum_{s,s'} \exp(\alpha_{k-1}^s + \beta_k^{s''} + \gamma_k^{00,s'' \to s})}\right),$$

where $z \in \{01, 10, 11\}$.

As in the binary case, extrinsic information is generated by one decoder and fed into the other decoder in order to update the log-likelihood ratios. The main difference is that in duo-binary mode, the expression for the extrinsic ($\lambda$) information contains no channel information, but is simply a subtraction of the input LLR from the output LLR:

$$L_e^{(z)}(d_k) = L^{(z)}(d_k) - L_a^{(z)}(d_k) \quad \text{[Eqn. 20]}$$

Calculation of the LLR—The calculation of the LLR follows similar principles to those outlined above for the binary code mode. For duo-binary, the decoding algorithms used are the Log-MAP algorithm and the Max-Log-MAP algorithm.

The Log-MAP Algorithm—The recursive equations for $\alpha$ and $\beta$ and the boundary conditions are identical to Equations 9 and 10. The branch metric, $\gamma^{z,s \to s'}$, is given by:

$$\gamma^{z,s \to s'} = \log(p(Y_k \mid d_k = z)) + \log(p(d_k = z)) \quad \text{[Eqn. 21]}$$

The last term in Equation 21 contains the extrinsic information, as in the binary code case. The LLR is given by:

$$L^{(2)}(d_k) = \log \left( \frac{\sum_{s,s',z} \exp(\alpha_{k-1}^s + \beta_k^{s'} + \gamma_k^{z,s' \to s})}{\sum_{s,s'} \exp(\alpha_{k-1}^s + \beta_k^{s''} + \gamma_k^{00,s'' \to s})} \right).$$ [Eqn. 22]

The Max-Log-MAP Algorithm—As in the binary code case, simple approximations for α and β are given by:

$$\alpha_k^s \approx \max_{s'}(\alpha_{k-1}^{s'} + \gamma^{d_k s \to s'}), \beta_{k=1}^s \approx \max_{s'}(\beta_k^{s'} + \gamma^{d_{k+1},s \to s'})$$ [Eqn. 23]

The branch metric, $\gamma^{z,s \to s'}$, is given by:

$$\gamma^{z,s \to s'} = \log(p(Y_k|d_k = z)) + \log(p(d_k = z)).$$ [Eqn. 24]

The last term in Equation 21 contains the extrinsic information, as in the binary case. The LLR is approximated as:

$$L^{(2)}(d_k) \approx \max_{s,s',z}(\alpha_{k-1}^{s'} + \beta_k^s + \gamma_k^{z,s \to s'}) - \max_{s,s'}(\alpha_{k-1}^{s'} + \beta_k^s + \gamma_k^{00,s \to s'})$$ [Eqn. 25]

From Equations 16 and 23 above, it can be seen that the Max-Log MAP algorithm may calculate the value of alpha (α) for both the binary code mode and duo-binary code mode using Equation 26 below:

$$\alpha_k^s \approx \max_{s'}(\alpha_{k-1}^{s'} + \gamma^{d_k s \to s'}).$$ [Eqn. 26]

Additionally, from Equations 16 and 23 above, it can be seen that the Max-Log MAP algorithm may calculate the value of beta (β) for both the binary code mode and duo-binary code mode using Equation 27 below:

$$\beta_{k=1}^s \approx \max_{s'}(\beta_k^{s'} + \gamma^{d_{k+1},s \to s'}).$$ [Eqn. 27]

In Equations 26 and 27, $\alpha_k^s$ and $\beta_k^{s-1}$ are the values for the current states and $\alpha_k^{s-1}$ and $\beta_k^s$ are the values from the previous states.

It is noted that the alpha and beta calculations have the same operations, but different operands. According to the principles of the present disclosure, if the operands are prepared correctly, the alpha and beta calculations may be performed by the same arithmetic logic unit (ALU) hardware.

It is further noted that Equations 17 and 25, which the Max-Log MAP algorithm uses to calculate the value of gamma (γ) for both the binary code mode and duo-binary code mode, are very similar to each other. Moreover, it is noted that Equations 17 and 25 use operations that are very similar to the alpha and beta calculations in Equations 26 and 27. Thus, according to the principles of the present disclosure, if the operands are prepared correctly, the lambda calculations may reuse the alpha and beta ALU hardware.

Figure 7:
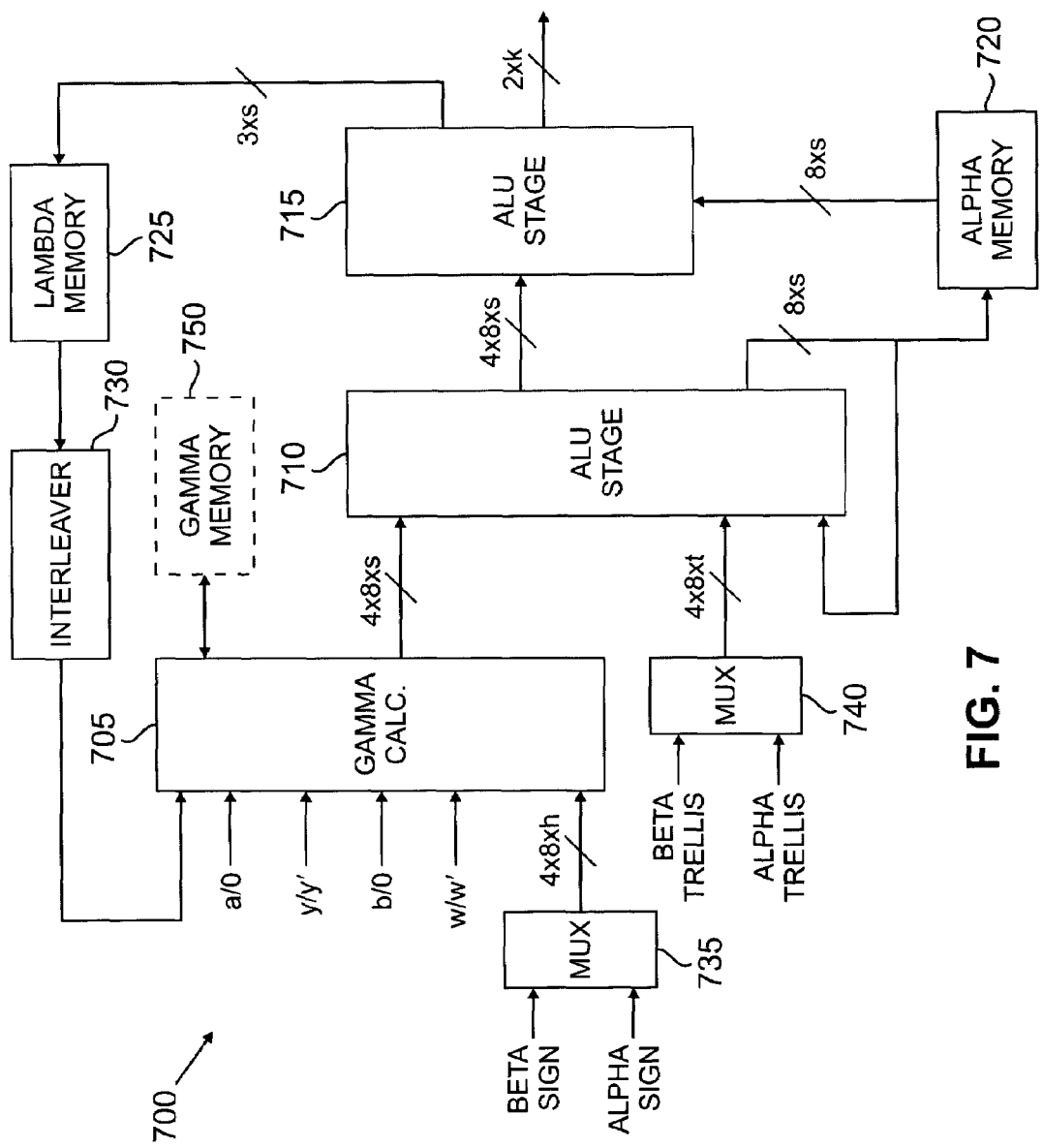
FIGS. 7 and 8 are high-level block diagrams of a reconfigurable MAP decoder that operates in WiBro and WCDMA modes.
Figure 8:
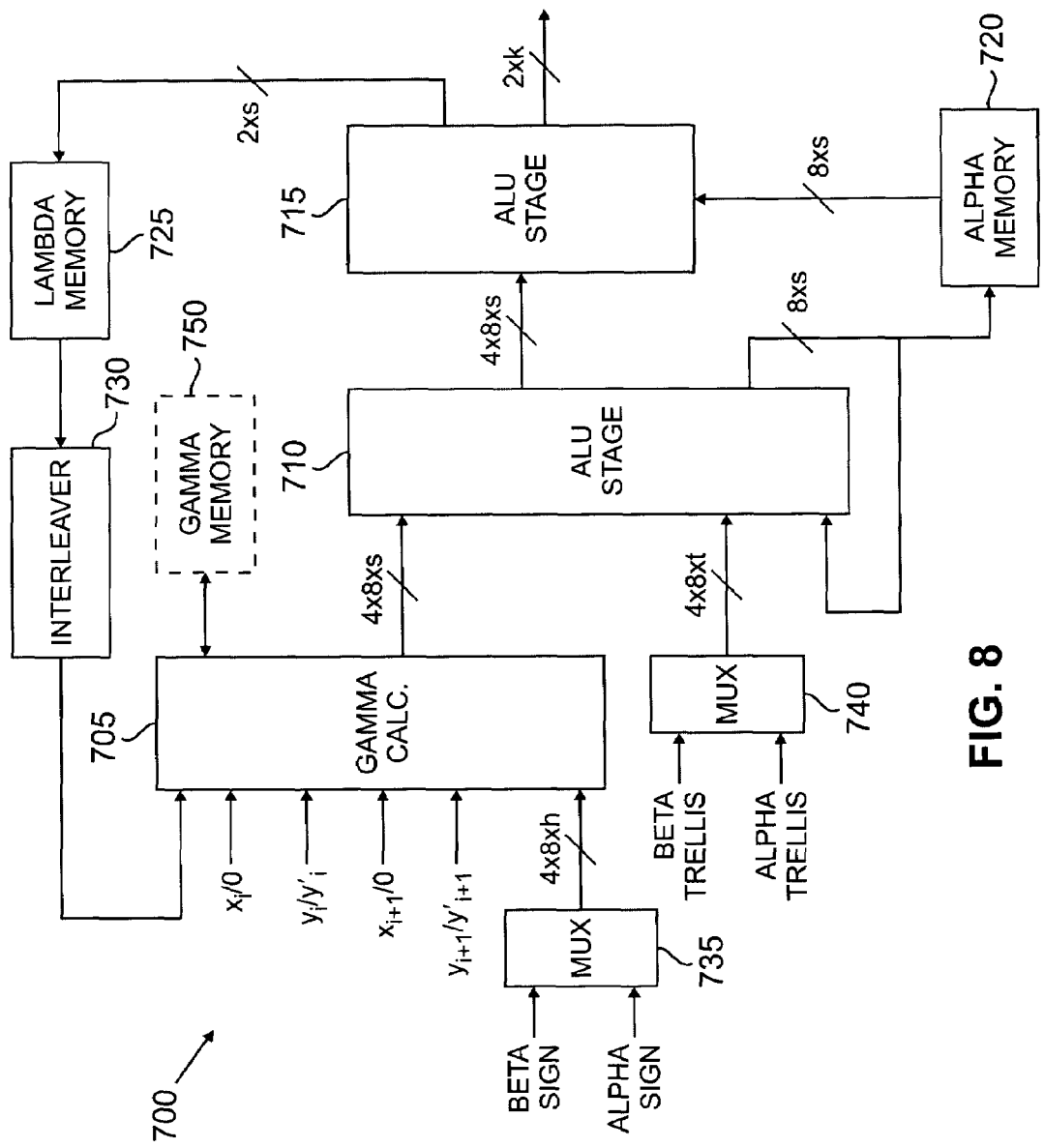

FIGS. 7 and 8 are high-level block diagrams of reconfigurable MAP decoder 700, which may be used in WiBro mode and in WCDMA mode. MAP decoder 700 comprises gamma calculation block 705, arithmetic logic unit (ALU) stage 710, arithmetic logic unit (ALU) stage 715, alpha memory 720, lambda memory 725, interleaver 730, multiplexer 735, multiplexer 740, and optional gamma memory 750. The diagram of reconfigurable MAP decoder 700 is a generalized representation of the functions performed by various components in FIG. 4A. For example, ALU stages 710 and 715, multiplexers 735 and 740, and gamma calculation block 705 may be implemented in each of MAP datapaths 432a-d. Similarly, interleaver 730 may be implemented by communication switch 420, lambda memory 725 may be implemented by extrinsic information memories 445a-d 430, alpha memory 720 may be implements by caches 433a-d, and so forth.

The reconfigurable and reprogrammable capabilities of MAP datapaths 432a-d and communication switch (i.e., interleaver) 420 enable reconfigurable MAP decoder 700 to operate in both duo-binary code (i.e., WiBro) systems and in binary code (i.e, WCDMA, HSDPA) systems. In FIG. 7, MAP decoder 700 operates in duo-binary code mode. In FIG. 8, MAP decoder 700 operates in binary code mode.

As will be explained below in greater detail, ALU stage 710 performs the alpha (α) calculations in Equation 26 and the beta (β) calculation in Equation 27 for both binary code mode and duo-binary code mode. No particular architecture is required for ALU stage 710. However, ALU stage 710 comprises an appropriate number of reconfigurable adders and comparators to perform the calculations in Equations 26 and 27.

As will be explained below in greater detail, the calculations of lambda (β) shown in Equations 17 and 25 are divided across ALU stage 710 and ALU stage 715 in both binary code mode and duo-binary code mode. ALU stage 715 also comprises an appropriate number of reconfigurable adders and comparators to perform (along with ALU stage 710) the calculations in Equations 17 and 25.

In the duo-binary code mode in FIG. 7, during a forward recursion, gamma calculation block 705 calculates and stores the branch metrics (or gamma (γ) values) using: i) input symbol information, namely the duo-binary inputs (a, b) and the parity inputs (y, y', w, w'); and ii) extrinsic (λ) information in lambda memory 525 via interleaver 730. In trellis 499 in FIG. 4B, there are 8 states for each time slot (or input symbol) and 4 branches associated with each state, for a total of 32 branches. In the exemplary embodiment, each soft input data sample comprises s=8 bits. Thus, the gamma output of gamma calculation block 505 is shown as 4×8×s in FIG. 7. Gamma calculation block 505 also receives beta sign select and alpha sign select information. In the exemplary embodiment, there are a total of h=4 sign select bits for each of the 4×8 branches shown in trellis 499. As noted above in FIG. 4A, the gamma value may be stored in gamma memory 750 (e.g., cache 433) in order to reduce power consumption.

In the duo-binary code mode in FIG. 7, during a forward recursion, ALU stage 710 calculates the alpha (α) value for each node in trellis 499. ALU stage receives the previous α value from alpha memory 720 (i.e., cache 433) and, as noted above, receives branch metric information (γ) from gamma calculation block 705. ALU stage 710 receives the alpha trellis information for each node via multiplexer 740. In the exemplary embodiment, each of the eight trellis state in trellis 499 is represented by t=3 bits (i.e., 000-111). Since there are 4×8=32 branches associated with the 8 trellis states, the alpha trellis information is shown as 4×8xt in FIG. 7. ALU stage 710 stores the s=8 bit alpha values for each of the eight trellis nodes in alpha memory 720.

In the duo-binary code mode in FIG. 7, during a backward recursion, ALU stage 710 calculates the beta (β) value for each node in trellis 499. The beta calculation process is very similar to the alpha calculation process. ALU stage 710 receives the previous β value and receives branch metric information (γ) from gamma calculation block 705. ALU stage 710 receives the beta trellis information for each node via multiplexer 740. Like the alpha trellis information, the beta trellis information is shown as 4×8xt in FIG. 7.

In the duo-binary code mode in FIG. 7, ALU stage 710 partially calculates the LLR (λ) values in Equation 25 using the α, β, and γ values for each of the 32 branches in trellis 499. ALU stage 715 completes the calculation of the LLR value. In duo-binary mode, the 2xk output of ALU stage 715 may be a hard decision pair of bits (k=1) or a pair of soft values (k=16 bits) that are sent to an external circuit for a decision. As noted above, all lambda values may be normalized by the L00 value, such that ALU stage 715 only needs to store three (3) s=16 bit values for L01, L10 and L11 in lambda memory 725.

The binary code mode in FIG. 8 operates similarly to the duo-binary code mode in FIG. 7. However, whereas duo-binary code operations process two bits (i.e., a and b) from a single time slot, reconfigurable MAP decoder 700 processes two consecutive binary bits from different time slots (k=i and k=i+1) during binary code mode. These two consecutive binary bits are arbitrarily referred to as $x_i$ and $x_{i+1}$ in FIG. 8. The corresponding parity bits are $y_i$ and $y'_i$ for the first input bit and $y_{i+1}$ and $y'_{i+1}$ for the second input bit.

In binary code mode, ALU stage 710 performs the alpha ($\alpha$) calculations in Equation 26 and the beta ($\beta$) calculation in Equation 27. ALU stage 710 partially calculates the LLR ($\lambda$) values in Equation 17 using the $\alpha$, $\beta$, and $\gamma$ values for each of the 32 branches in trellis 499. ALU stage 715 completes the calculation of the LLR value. In binary mode, the 2xk output of ALU stage 715 may be a hard decision pair of bits (k=1) or a pair of soft values (k=16 bits) that are sent to an external circuit for a decision. ALU stage 715 stores two k=16 bit lambda values in lambda memory 725, one for each of the two input samples (i.e., $x_i$ and $x_{i+1}$).

During the processing of a large received data block, the forward direction processing (recursion) generates a large number of intermediate results (i.e., alpha values). This requires that alpha memory 720 be quite large—on the order of 50% of the total memory in reconfigurable MAP decoder 700. To reduce the size of alpha memory 720 (i.e., caches 433), reconfigurable MAP decoder 700 uses segmentation to divide up the received data block into smaller segments.

Figure 9A:
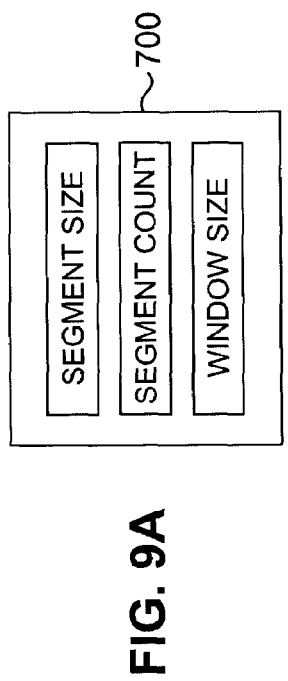
FIGS. 9A and 9B illustrate a segmentation method for reducing the memory requirements of the reconfigurable MAP decoder according to one embodiment of the disclosure.
Figure 9B:
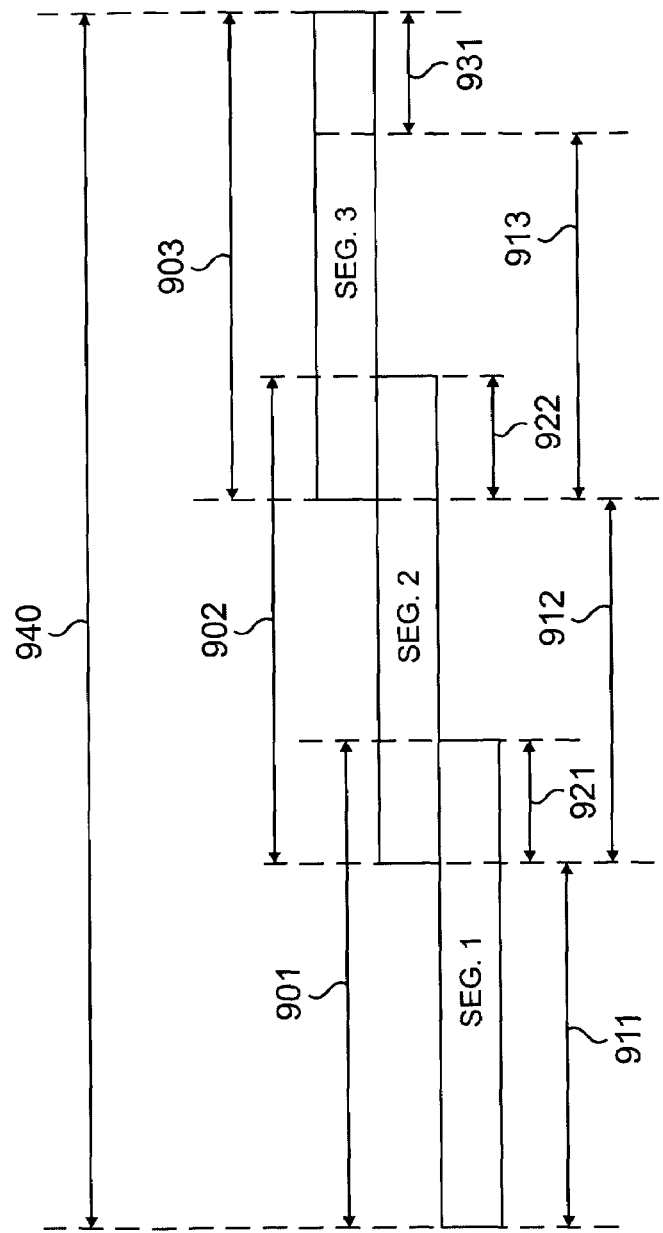

FIGS. 9A and 9B illustrate a segmentation method for reducing the memory requirements of reconfigurable MAP decoder 700 according to one embodiment of the disclosure. MAP decoder 700 comprises registers that hold values defining the block segmentation process: a Segment Size register, a Segment Count register and a Window Size register. The Segment Size value defines the segment size, as opposed to the size of the total received data block. The Segment Count value defines the number of segments. If the Segment Count is equal to 1, the Segment Size is the same as the total received data block size. Although in the illustrated embodiment, it is assumed that all segments are the same size, in an alternate embodiment the segments may have different sizes. In such an embodiment, the Segment Size register may contain multiple values.

The Window Size value defines the step size between segments. The Window Size value may be equal to the total block size divided by the Segment Count value. The Window Size step may be smaller than the whole segment to allow processing of overlapping portions of segments, thereby adding a learning period between segments and increasing BER performance. MAP decoder 700 may also use registers to save state information between segments for both feedforward processing (alpha) and feedback processing (beta) in both the interleaved and non-interleaved domains.

Each one of processing units 430a-d may independently segment a received data block and then process each segment sequentially. FIG. 9B shows three overlapping segments (Segment 1, Segment 2 and Segment 3) that are processed by exemplary processing unit 430a. Line 940 indicates the total block size. Lines 901, 902 and 903 indicated the segment sizes of Segment 1, Segment 2 and Segment 3, respectively. Lines 911, 912 and 913 indicate the sizes of the processing windows (hereafter, windows 911, 912, and 913). Lines 921 and 922 indicate the overlap periods of Segments 1 and 2 and Segments 2 and 3, respectively (hereafter, overlap periods 921 and 922).

Line 931 indicates the tail idle padding (hereafter, tail idle period 931). In cases when there is no exact division between the total block size and the segment size (e.g., any time that segment size greater than window size), idle values may be padded in the end of the block to get the exact division.

By way of example, each of Segments 1-3 may comprise 1000 samples, with overlap periods of 50 samples. Thus, Segment 1 comprises Samples 1-1000 (from left to right). Segment 2 comprises Samples 951-1950 (from left to right). Segment 3 comprises samples 1901-2900. Thus, overlap period 921 comprises Samples 951-1000 and overlap period 922 comprises Samples 1901-1950. The total block size is 2900 samples. In an exemplary embodiment, the total block size may be in reality be, for example, 2850 samples of actual received data and the last 50 samples of Segment 3 are tail idle padding data that are added in tail idle period 931.

Processing unit 430a processes Segment 1 in the forward direction from Sample 1 to Sample 1000 to thereby generate 1000 alpha values. Since Segment 1 is the first segment to be processed, default initial values may be used in processing the first alpha value, starting at Sample 1. Subsequent alpha values are calculated using actual alpha values from previous states and become more accurate as a result.

Processing unit 430a processes Segment 2 in the forward direction from Sample 951 to Sample 1950 to thereby generate 1000 alpha values. Assuming no alpha values are carried over from Segment 1, default initial values may be used in processing the first alpha value, starting at Sample 951. Subsequent alpha values are calculated using actual alpha values from previous states and are more and more accurate as a result.

Processing unit 430a processes Segment 1 in the reverse direction from Sample 1000 to Sample 1 to thereby generate beta and lambda values. Default initial values may be used in processing the first beta value, starting at Sample 1000. Subsequent beta values are calculated using actual beta values from previous states and become more accurate as a result. Samples 951-1000 in overlap period 921 represent a learning period for beta calculations during reverse processing.

Processing unit 430a processes Segment 2 in the reverse direction from Sample 1950 to Sample 951 to thereby generate beta and lambda values. Default initial values may be used in processing the first beta value, starting at Sample 1950. Subsequent beta values are calculated using actual beta values from previous states and are more accurate as a result. Samples 1901-1950 in overlap period 922 represent a learning period for beta calculations during reverse processing.

In overlap period 921, beta values from Segment 2, which are based on previous state information, will tend to be more accurate than the beta values from Segment 1, which are based on an initial default value. Thus, in window 911, processing unit 430a calculates the lambda values in Segment 1 from Sample 950 to Sample 1 during reverse processing using the Segment 1 alpha values and the Segment 1 beta values.

However, in overlap period 921, processing unit 430a does not calculate lambda values during the backward recursion of Segment 1. Instead, processing unit calculates lambda values for Samples 951-1000 using beta values calculated for Samples 951-1000 during the reverse processing in window 912 for Segment 2. Similarly, in overlap period 922, processing unit 430a may calculate the lambda values for Samples 1901-1950 using beta values for Samples 1901-1950 during the reverse processing in window 913 for Segment 3.

The memory requirements of processing unit 430a are reduced by means of segmentation, since a smaller number of alpha values need to be stored from the forward recursion. However, the accuracy of the lambda calculations are improved over the prior art by using overlap periods 921 and 922 as learning periods for beta calculations during reverse processing.

Figure 10:
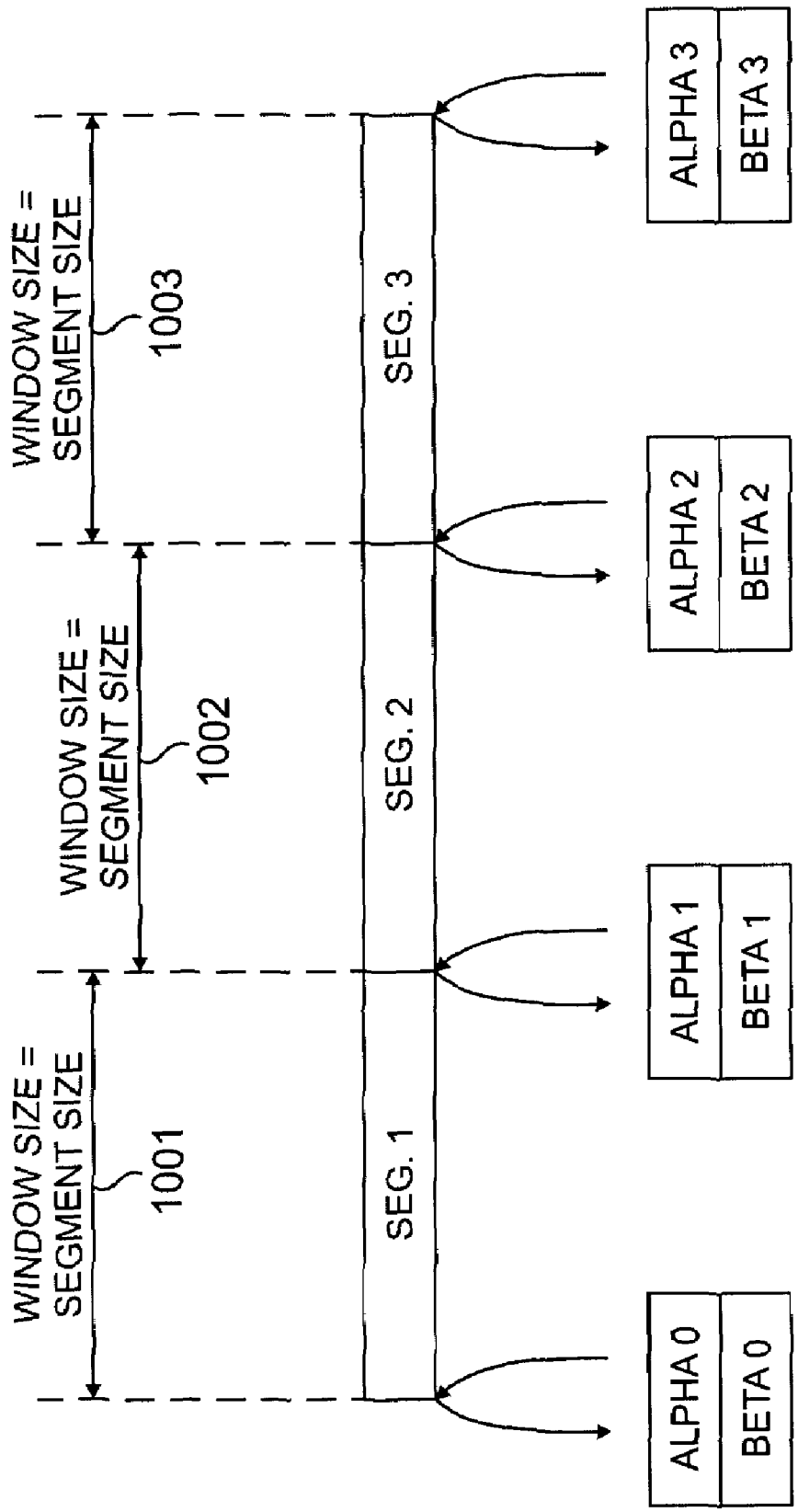
FIG. 10 illustrate a segmentation method for reducing the memory requirements of the reconfigurable MAP decoder according to another embodiment of the disclosure.

The description of FIG. 9B above assumes that alpha values from one segment are not carried over to the next segment. FIG. 10 illustrate a segmentation method for reducing the memory requirements of the reconfigurable MAP decoder according to another embodiment of the disclosure. In FIG. 9B, no overlapping periods are used. Thus, the window sizes and the segment sizes are the same, as indicated by lines 1001, 1002 and 1003.

However, state information may be saved from one segment to the next segment. Thus, at the segmentation boundary between Segment 1 and Segment 2 in FIG. 10, the value Alpha 1 may be saved in a dedicated register in MAP decoder 700 at the end of the forward processing of Segment 1. Assuming there are 1000 samples per segment, the alpha value for Sample 1000 is saved at the end of the forward processing of Segment 1. At the start of the Segment 2 forward processing, the saved alpha value for Sample 1000 is then retrieved from the dedicated register and is used in the calculation of the alpha value for Sample 1001 at the start of Segment 2.

Advantageously, the method of using overlapping learning periods 921 and 922 described in FIG. 9B may be combined with the method of using saved state information described in FIG. 10 to obtain accurate lambda values. Thus, in FIG. 9B for example, processing unit 430a may calculate alpha values in window 911 from Sample 1 to Sample 950 during forward processing of Segment 1. Processing unit 430a then stores the alpha value for Sample 950 and skips to Sample 1000 to begin the beta calculations for reverse processing of Segment 1. After overlapping learning period 921, processing unit 430a uses the beta value for Sample 951 and the stored alpha values from the forward recursion of Segment 1 to begin calculating beta values and lambda values from Sample 950 to Sample 1.

During forward processing of Segment 2, processing unit 430a retrieves the stored alpha value for Sample 950 from Segment 1 forward processing. Processing unit 430a uses the stored alpha value for Sample 950 as an accurate initial state, rather than assuming a default value for the initial state. Processing unit 403a then calculates alpha values in window 912 from Sample 951 to Sample 1900 during forward processing of Segment 2. Processing unit 430a then stores the alpha value for Sample 1900 and skips to Sample 1950 to begin the beta calculations for reverse processing of Segment 2. After overlapping learning period 922, processing unit 430a uses the beta value for Sample 1901 and the stored alpha values from the forward recursion of Segment 2 to begin calculating beta values and lambda values from Sample 1900 to Sample 951.

The use of overlapping learning periods between segments and the saving of boundary state information between segments enables MAP decoder 700 to greatly reduce the required size of alpha memory 720, while minimizing inaccuracies in the calculations of beta and lambda caused by segmentation methods used in conventional decoding systems.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A maximum a posteriori probability (MAP) block decoder for decoding a received data block of input samples, wherein the MAP block decoder is operable to segment the received data block into at least a first segment and a second segment and calculate and store alpha values during forward processing of the first segment, wherein the first segment differs in size from the second segment, and wherein the MAP block decoder uses a first selected alpha value calculated during forward processing of the first segment as initial state information during forward processing of the second segment.

2. The MAP block decoder as set forth in claim 1, wherein the MAP block decoder calculates and stores alpha values during a forward processing of the second segment, and wherein the MAP block decoder uses a second selected alpha value stored during forward processing of the second segment as initial state information during forward processing of a third segment.

3. The MAP block decoder as set forth in claim 1, wherein the first and second segments overlap each other, such that the last M samples of the first segment are the same as the first M samples of the second segment, the first segment thereby comprising a first non-overlapping portion and an overlapping portion and the second segment thereby comprising a second non-overlapping portion and the overlapping portion.

4. The MAP block decoder as set forth in claim 3, wherein the first selected alpha value is the last alpha value calculated and stored by the MAP block decoder prior to the overlapping portion of the first segment.

5. The MAP block decoder as set forth in claim 4, wherein the MAP block decoder, after storing the first selected alpha value, calculates beta values during reverse processing of the first segment, beginning with the last sample in the first segment.

6. The MAP block decoder as set forth in claim 5, wherein the MAP block decoder calculates beta values associated with samples in the overlapping portion of the first and second segments during reverse processing of the first segment to thereby generate a first selected beta value.

7. The MAP block decoder as set forth in claim 6, wherein the MAP block decoder calculates lambda values during reverse processing of the first segment using alpha values and beta values associated with samples from the first non-overlapping portion of the first segment.

8. A reconfigurable turbo decoder comprising:
N processing units operating independently such that a first one of the N processing units may be selected to decode received input samples while a second one of the N processing units may be disabled, wherein each of the N processing units comprises a maximum a posteriori probability (MAP) block decoder for decoding a received data block of input samples, wherein the MAP block decoder is operable to segment the received data block into at least a first segment and a second segment and calculate and store alpha values during forward processing of the first segment, wherein the first segment differs in size from the second segment, wherein the MAP block decoder uses a first selected alpha value calculated during forward processing of the first segment as initial state information during forward processing of the second segment.

9. The reconfigurable turbo decoder as set forth in claim 8, wherein the MAP block decoder calculates and stores alpha values during a forward processing of the second segment, and wherein the MAP block decoder uses a second selected alpha value calculated during forward processing of the second segment as initial state information during forward processing of a third segment.

10. The reconfigurable turbo decoder as set forth in claim 8, wherein the first and second segments overlap each other, such that the last M samples of the first segment are the same as the first M samples of the second segment, the first segment thereby comprising a first non-overlapping portion and an overlapping portion and the second segment thereby comprising a second non-overlapping portion and the overlapping portion.

11. The reconfigurable turbo decoder as set forth in claim 10, wherein the first selected alpha value is the last alpha value calculated and stored by the MAP block decoder prior to the overlapping portion of the first segment.

12. The reconfigurable turbo decoder as set forth in claim 11, wherein the MAP block decoder, after storing the first selected alpha value, calculates beta values during reverse processing of the first segment, beginning with the last sample in the first segment.

13. The reconfigurable turbo decoder as set forth in claim 12, wherein the MAP block decoder calculates beta values associated with samples in the overlapping portion of the first and second segments during reverse processing of the first segment to thereby generate a first selected beta value.

14. The reconfigurable turbo decoder as set forth in claim 13, wherein the MAP block decoder calculates lambda values during reverse processing of the first segment using alpha values and beta values associated with samples from the first non-overlapping portion of the first segment.

15. A software-defined radio (SDR) system capable of operating under a plurality of wireless communication standards, the SDR system comprising a reconfigurable turbo decoder, wherein the reconfigurable turbo decoder comprises N processing units and wherein each of the N processing units comprises a maximum a posteriori probability (MAP) block decoder for decoding a received data block of input samples, wherein the MAP block decoder is operable to segment the received data block into at least a first segment and a second segment and calculate and store alpha values during forward processing of the first segment, wherein the first segment differs in size from the second segment, wherein the MAP block decoder uses a first selected alpha value calculated during forward processing of the first segment as initial state information during forward processing of the second segment.

16. The software-defined radio (SDR) system as set forth in claim 15, wherein the MAP block decoder calculates and stores alpha values during a forward processing of the second segment, and wherein the MAP block decoder uses a second selected alpha value stored during forward processing of the second segment as initial state information during forward processing of a third segment.

17. The software-defined radio (SDR) system as set forth in claim 15, wherein the first and second segments overlap each other, such that the last M samples of the first segment are the same as the first M samples of the second segment, the first segment thereby comprising a first non-overlapping portion and an overlapping portion and the second segment thereby comprising a second non-overlapping portion and the overlapping portion.

18. The software-defined radio (SDR) system as set forth in claim 17, wherein the first selected alpha value is the last alpha value calculated and stored by the MAP block decoder prior to the overlapping portion of the first segment.

19. The software-defined radio (SDR) system as set forth in claim 18, wherein the MAP block decoder, after storing the first selected alpha value, calculates beta values during reverse processing of the first segment, beginning with the last sample in the first segment.

20. The software-defined radio (SDR) system as set forth in claim 19, wherein the MAP block decoder calculates beta values associated with samples in the overlapping portion of the first and second segments during reverse processing of the first segment to thereby generate a first selected beta value.

21. The software-defined radio (SDR) system as set forth in claim 20, wherein the MAP block decoder calculates lambda values during reverse processing of the first segment using alpha values and beta values associated with samples from the first non-overlapping portion of the first segment.

22. A method of performing block decoding of a data block of input samples according to the maximum a posteriori probability (MAP) algorithm, the method comprising the steps of:
    receiving the data block of input samples;
    segmenting, by at least one processing unit in a plurality of processing units within a reconfigurable decoder, the received data block into at least a first segment and a second segment that partially overlaps the first segment, wherein the first segment comprises a first non-overlapping portion and an overlapping portion and the second segment comprises a second non-overlapping portion and the overlapping portion, wherein the first segment differs in size from the second segment;
    during forward processing of the first segment, calculating and storing alpha values for the first non-overlapping portion of the first segment;
    retrieving a first selected alpha value calculated during forward processing of the first segment; and
    using the first selected alpha value as initial state information during forward processing of the second segment.

23. The method as set forth in claim 22, wherein the first selected alpha value is the last alpha value calculated and stored during forward processing of the first non-overlapping portion of the first segment.

24. The method as set forth in claim 23, further comprising the step of:
    after storing the first selected alpha value, calculating beta values during reverse processing of the first segment, beginning with the last sample in the first segment.

25. The method as set forth in claim 24, further comprising the step of: calculating lambda values during reverse processing of the first segment using alpha values and beta values associated with samples from the first non-overlapping portion of the first segment.

* * * * *